United States Patent
O'Malley

(10) Patent No.: US 11,526,721 B1
(45) Date of Patent: Dec. 13, 2022

(54) SYNTHETIC SCENARIO GENERATOR USING DISTANCE-BIASED CONFIDENCES FOR SENSOR DATA

(71) Applicant: Zoox, Inc., Foster City, CA (US)

(72) Inventor: Bryan Matthew O'Malley, Oviedo, FL (US)

(73) Assignee: Zoox, Inc., Foster, CA (US)

( * ) Notice: Subject to any disclaimer, the term of this patent is extended or adjusted under 35 U.S.C. 154(b) by 369 days.

(21) Appl. No.: 16/798,073

(22) Filed: Feb. 21, 2020

(51) Int. Cl.
| | |
|---|---|
| *G06N 3/00* | (2006.01) |
| *G06N 20/00* | (2019.01) |
| *B60W 50/04* | (2006.01) |
| *G06N 5/04* | (2006.01) |
| *B60W 50/00* | (2006.01) |
| *G05D 1/00* | (2006.01) |

(52) U.S. Cl.
CPC ............. *G06N 3/006* (2013.01); *B60W 50/04* (2013.01); *G06N 5/04* (2013.01); *G06N 20/00* (2019.01); *B60W 2050/0031* (2013.01); *G05D 1/0088* (2013.01)

(58) Field of Classification Search
CPC .................................................. G06N 3/006
See application file for complete search history.

(56) References Cited

U.S. PATENT DOCUMENTS

| | | | |
|---|---|---|---|
| 9,043,129 B2 * | 5/2015 | Bonefas ............... | G05D 1/0223 |
| | | | 701/300 |
| 9,507,346 B1 | 11/2016 | Levinson et al. | |
| 9,606,539 B1 | 3/2017 | Kentley et al. | |
| 9,612,123 B1 | 4/2017 | Levinson et al. | |
| 9,632,502 B1 | 4/2017 | Levinson et al. | |
| 9,720,415 B2 | 8/2017 | Levinson et al. | |
| 9,874,878 B2 * | 1/2018 | Wang ................... | G05D 1/0676 |
| 10,176,278 B2 * | 1/2019 | Belmans ................ | G06F 30/20 |
| 10,496,766 B2 * | 12/2019 | Levinson ............... | G06F 30/20 |
| 10,534,370 B2 * | 1/2020 | Cavalcanti ............ | G08G 1/091 |
| 10,852,721 B1 | 12/2020 | Smith et al. | |
| 11,086,318 B1 | 8/2021 | Davis et al. | |
| 11,150,660 B1 * | 10/2021 | Kabirzadeh .......... | G05D 1/0088 |
| 11,210,537 B2 * | 12/2021 | Koivisto ............. | G06K 9/6218 |
| 11,288,693 B2 * | 3/2022 | Bronicki ............... | G06V 20/52 |

(Continued)

OTHER PUBLICATIONS

The PCT Search Report and Written Opinion dated Sep. 24, 2020 for PCT Application No. PCT/US20/39796, 9 pages.

(Continued)

*Primary Examiner* — Michael A Berns
(74) *Attorney, Agent, or Firm* — Lee & Hayes, P.C.

(57) ABSTRACT

A vehicle can capture data that can be converted into a synthetic scenario for use in a simulator. Objects can be identified in the data and attribute data associated with the objects can be determined. Updated attribute data may be determined based on confidence values and/or distance measurements associated with the attribute data. The object and attribute data may be used to generate synthetic scenarios of a simulated environment, including simulated objects that traverse the environment and perform actions based on the attribute data associated with the simulated objects, the captured data, and/or interactions within the simulated environment. The scenarios can be used for testing and validating interactions and responses of a vehicle controller within the simulated environment.

20 Claims, 11 Drawing Sheets

(56) References Cited

U.S. PATENT DOCUMENTS

| | | |
|---|---|---|
| 2012/0083982 A1 | 4/2012 | Bonefas et al. |
| 2014/0180653 A1 | 6/2014 | Belmans |
| 2017/0023945 A1 | 1/2017 | Cavalcanti et al. |
| 2017/0075359 A1 | 3/2017 | Wang |
| 2017/0132334 A1 | 5/2017 | Levinson et al. |
| 2018/0307245 A1 | 10/2018 | Khawaja et al. |
| 2019/0079194 A1 | 3/2019 | Kuffner |
| 2019/0129831 A1 | 5/2019 | Goldberg |
| 2019/0205667 A1 | 7/2019 | Avidan et al. |
| 2019/0278290 A1 | 9/2019 | Zhang et al. |
| 2020/0084278 A1 | 3/2020 | Cheng et al. |
| 2020/0134494 A1 | 4/2020 | Venkatadri |
| 2020/0192365 A1 | 6/2020 | Russell et al. |
| 2020/0292326 A1 | 9/2020 | Rabel et al. |
| 2020/0341466 A1 | 10/2020 | Pham et al. |
| 2020/0393845 A1 | 12/2020 | Wang et al. |
| 2020/0410062 A1* | 12/2020 | O'Malley ............ G05D 1/0088 |
| 2020/0410063 A1* | 12/2020 | O'Malley ................ G07C 5/02 |
| 2020/0410254 A1 | 12/2020 | Pham et al. |
| 2021/0201145 A1 | 7/2021 | Pham et al. |
| 2021/0286925 A1 | 9/2021 | Wyrwas et al. |
| 2021/0303882 A1 | 9/2021 | Mallela et al. |
| 2021/0309223 A1 | 10/2021 | Zhu |
| 2021/0341921 A1 | 11/2021 | Davis et al. |

OTHER PUBLICATIONS

Kar et al, "Meta-Sim: Learning to Generate Synthetic Datasets", arXiv, 2019, 14 pages.

Office Action for U.S. Appl. No. 16/457,745, dated Jan. 5, 2022, O'Malley, "Synthetic Scenario Simulator Based on Events", 16 Pages.

Office Action for U.S. Appl. No. 16/457,679, dated Dec. 17, 2021, O'Malley, "Synthetic Scenario Generator Based on Attributes", 29 pages.

The International Report on Preliminary Patentability for PCT Application No. PCT/US20/39796, dated Jan. 6, 2022.

The International Report on Preliminary Patentability for PCT App No. PCT/US20/39796, dated Dec. 28, 2021.

Rosique et al , A Sstematic Review of Perception System and Simulators for Autonomous Vehicles Research, MDPI, 2019, 29 pages.

Office Action for U.S. Appl. No. 16/457,679, dated Apr. 29, 2022, O'Malley, "Synthetic Scenario Generator Based on Attributes", 31 pages.

Office Action for U.S. Appl. No. 16/457,745, dated May 13, 2022, O'Malley, "Synthetic Scenario Simulator Based on Events" 16 pages.

* cited by examiner

OBJECT ATTRIBUTE DATA TABLE 302

| | $t_0$ | | | $t_1$ | | | $t_2$ | | |
|---|---|---|---|---|---|---|---|---|---|
| | Data | Conf. | Dist. | Data | Conf. | Dist. | Data | Conf. | Dist. |
| OBJECT 1 | | | | | | | | | |
| LENGTH | 5.1 | 80% | 10.5M | 5.2 | 81% | 18.0M | 0.3 | 80% | 23.3M |
| CLASSIFICATION | CAR | 95% | 10.5M | CAR | 92% | 18.0M | CYCLIST | 91% | 23.3M |
| VELOCITY | 4.5 | 73% | 10.5M | 4.8 | 75% | 18.0M | 4.5 | 72% | 23.3M |
| OBJECT 2 | | | | | | | | | |
| LENGTH | 6.1 | 71% | 23.8M | 13.0 | 77% | 20.2M | 5.9 | 70% | 28.9M |
| CLASSIFICATION | CAR | 94% | 23.8M | CAR | 94% | 20.2M | TRUCK | 93% | 28.9M |
| VELOCITY | 4.2 | 70% | 23.8M | 4.8 | 71% | 20.2M | 4.3 | 69% | 28.9M |
| OBJECT 3 | | | | | | | | | |
| LENGTH | 4.6 | 87% | 7.1M | 4.5 | 67% | 19.6M | 4.5 | 66% | 21.4M |
| CLASSIFICATION | CAR | 96% | 7.1M | CAR | 94% | 19.6M | CAR | 93% | 21.4M |
| VELOCITY | 5.0 | 73% | 7.1M | 5.1 | 69% | 19.6M | 54.6 | 69% | 21.4M |

ATTRIBUTES COMPONENT 306

COMPUTING DEVICE(S) 308

SYNTHETIC SCENARIO GENERATOR USING DISTANCE-BIASED CONFIDENCES FOR SENSOR DATA

BACKGROUND

Simulated data and simulations can be used to test and validate the functionality of a system, some of which would be otherwise prohibitive to test in the real world (e.g., due to safety concerns, limitations on time, repeatability, etc.). However, simulations that accurately reflect real-world scenarios to be tested may be difficult to create, as data used to create such simulations may be noisy, inconsistent, and/or incomplete. Additionally, such data may make testing updated system algorithms otherwise impossible when based on static data.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIGS. 3A and 3B depict an example object attribute data table including object attribute data associated with sensor data, and an updated attribute value table including updated attribute values generated by an attributes component.

DETAILED DESCRIPTION

Figure 1:
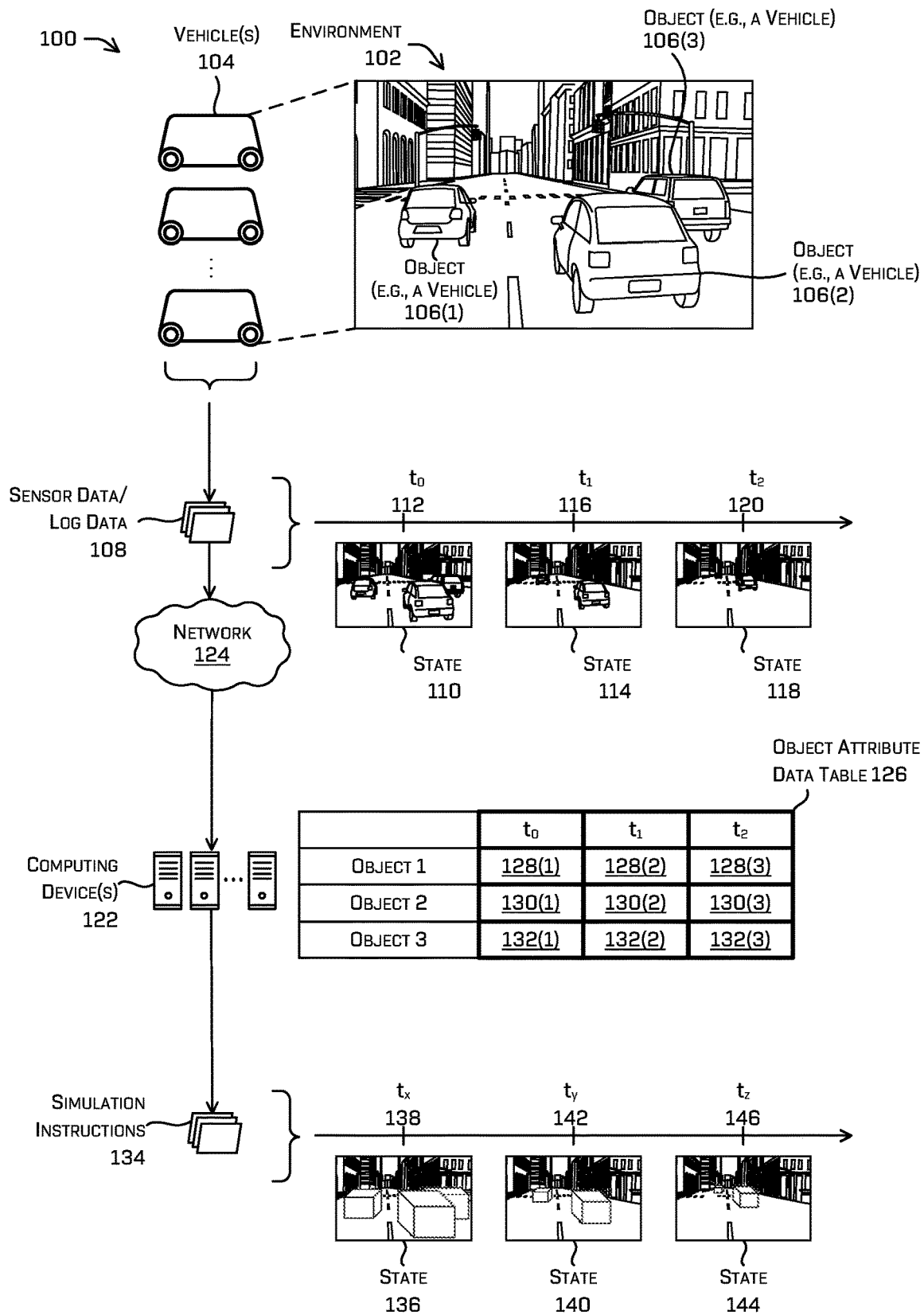
FIG. 1 is an illustration of vehicle(s) generating log data based on sensor data, and transmitting the log data to computing device(s) that determines attributes associated with objects and generates simulation instructions for a simulated environment.

This disclosure describes systems, methods, and apparatuses for generating synthetic data for simulation scenarios, based on data captured by sensors in a physical environment. In the context of an autonomous vehicle, sensors on a vehicle can capture sensor data as the vehicle traverses an environment. Such sensor data can represent data about objects in an environment such as classification type, position, size, velocity, pose, and the like. The sensor data or determinations from such sensor data may include inconsistencies (e.g., a determined size of an object may vary based on sensor and/or algorithm accuracy). In generating simulated data based on such sensor data, distance measurements between the sensor and the object in an environment can be used to weight various attribute data to determine updated attribute data that may represent a simulated object. Further, the distance measurements may be used in conjunction with a confidence value associated with individual attribute data to determine updated attribute data.

In at least some examples, such simulations can be used to test a controller of an autonomous vehicle. Simulations can be used to validate software (e.g., an autonomous controller) executed on autonomous vehicles to ensure that the software is able to safely control such autonomous vehicles. In additional or alternative examples, simulations can be used to learn about the constraints of autonomous vehicles that use the autonomous controller. For instance, simulations can be used to understand the operational space of an autonomous vehicle (e.g., an envelope of parameters in which the autonomous controller effectively controls the autonomous vehicle) in view of surface conditions, ambient noise, faulty components, etc. Simulations can also be useful for generating feedback for improving operations and designs of autonomous vehicles. For instance, simulations can be useful for determining an amount of redundancy that is required in an autonomous controller, or how to modify a behavior of the autonomous controller based on what is learned through simulations. Furthermore, in additional and alternative examples, simulations can be useful to inform the hardware design of autonomous vehicles, such as optimizing placement of sensors on an autonomous vehicle.

When creating a simulation environment to perform testing and validation, it is possible to specifically instantiate the environment with various and specific examples. Each instantiation of such an environment can be unique and defined. Enumerating all possible scenarios manually can require inordinate amounts of time and, if not every possible scenario is constructed, various scenarios can go untested. Additionally, even though multiple scenarios can be described, there is no guarantee that the additional scenarios provide any additional, useful, information. For example, incremental differences in starting positions of simulated vehicles at an intersection can only provide marginal, if any, additional useful information about the ability of an autonomous vehicle to respond in the scenario given a particular set of computer code. However, previously recorded sensor data from a system operating in an environment, such as an autonomous vehicle traversing an environment (which may include occasions of controller disengagement or other challenging scenarios), provides many examples for generating scenarios. Therefore, previously recorded sensor data can be used to quickly and efficiently generate high quality scenarios for testing.

In some instances, the log data can include abnormalities and/or inconsistencies. For example, the log data can indicate that an object in the environment (such as a parked vehicle) can change in size or position over time, which may not accurately represent the world. In some instances, other attributes of objects can be identified as inconsistent such as a pose of an object, a velocity, a classification, a trajectory, etc. In some instances, the log data can include a confidence level associated with an attribute. By way of example and without limitation, the log data can indicate that an object has a pedestrian classification and a confidence level of 5% (e.g., as determined and/or output by a perception system associated with a vehicle) associated with the pedestrian classification which can be compared to a confidence level threshold. The confidence level (or confidence value) can be based on various data such as the sensor type, a percentage occlusion of the object, the current lighting and weather conditions, etc.

Accordingly, in some examples, an attributes component may detect, identify, and remove the inconsistencies within attribute data determined for the objects in an environment. For example, the attributes component may discard inconsistent data and/or replace inconsistent data to smooth out the inconsistent log data for generation of improved simulation instructions. Additionally, the attributes component may resolve inconsistencies in attribute data by distance-biasing the confidence values associated with the attribute data. Removing the inconsistencies in object attributes can improve the quality of testing and validation when the purpose of simulation can be to test and validate a response of a simulated vehicle to various scenarios.

In some instances, the purpose of simulation can be to test and validate a response of a simulated vehicle to a defective and/or a faulty sensor of the vehicle. In such an example, the scenario generator can be configured to introduce inconsistencies in attributes associated with a simulated object in a simulated environment.

A vehicle or multiple vehicles can traverse an environment and generate log data associated with the environment. In some examples, log data may include raw sensor data and/or data based on sensor data (e.g., bounding boxes, velocities, classifications, object dimensions, etc.). Examples of data generated by a vehicle that can be included in the log data 108 can be found, for example, in U.S. patent application Ser. No. 15/644,267 titled "Interactions Between Vehicle and Teleoperations System" and filed Jul. 7, 2017 (describing communication signals that can include sensor data and data indicating an occurrence of an event as well vehicle control data that can be derived from data received from a sensor and a planner, an object data calculator, an object classifier, a collision predictor system, a kinematics calculator, a safety system actuator, and a control operation of the drive system), U.S. patent application Ser. No. 15/693,700 titled "Occupant Protection System Including Expandable Curtain and/or Expandable Bladder" and filed Sep. 1, 2017 (describing data representative of a trajectory of the vehicle, location data, object data, and vehicle control data, and U.S. patent application Ser. No. 16/198,653 titled "Executable Component Interface and Controller" filed Nov. 21, 2018 (describing a type of log data), which are each incorporated by reference in their entirety.

The log data can be used to generate simulation instructions that, when executed by a simulator, generate a simulated environment. When generating the simulation instructions, the scenario generator can identify objects represented in the log data. For example, the scenario generator can use perception data to determine the objects of the environment. The objects can include static objects (e.g., buildings, trees, road surfaces, road markers, signage, etc.) and dynamic objects (e.g., vehicles, pedestrians, animals, bicyclists, motorcycles, etc.).

In some instances, the scenario generator can determine an amount of interaction between the vehicle and the objects. For purposes of illustration only, the log data can indicate that the vehicle performed a lane change action, a turning action, and/or an acceleration action, etc. based on a detection of an object, an action associated with the object, and/or a predicted action associated with the object. In some instances, the scenario generator can omit objects from the simulated scenario that do not meet or exceed a threshold level of interaction with the vehicle. By excluding objects that do not meet or exceed the threshold level of interaction with the vehicle, the scenario generator can reduce an amount of computational resources required to generate and execute the simulated scenario.

In at least some examples, merely instantiating a simulation with log data may cause other errors and/or lead to invalid tests, for example. In some such examples, when a planning algorithm of the autonomous vehicle controller is altered, for example, objects traversing the environment according to temporal triggers may not interact with the simulated autonomous vehicle as intended to test such updated planning algorithms. To rectify such deficiencies, and after identifying the objects for use in the simulated scenario, the scenario generator can determine object attributes associated with the objects. For purposes of illustration only, the log data can represent a period of time that runs from time $t_0$ to time $t_5$. The scenario generator can identify a pedestrian that is detected by the vehicle at a time $t_1$ and becomes occluded by a tree at time $t_3$. The scenario generator can associate object attributes with the pedestrian that correspond to, for example, each time that the vehicle can detect the pedestrian (e.g., $t_1$, $t_2$, and $t_3$). The object attributes can include attributes such as an object extent (also referred to as an object size), an object classification, an object pose, an object trajectory, an object waypoint, an object instantiation attribute, and/or an object termination attribute (also referred to as a destruction attribute). In any number of examples, such attributes can be translated from a temporal connotation to a contextual connotation. As a non-limiting example, if a pedestrian enters a crosswalk at is at a point when the vehicle is a distance, d, away, the simulation may instantiate the pedestrian in the crosswalk not at $t_5$, but when a distance, d, from the crosswalk.

Additional object parameters can be determined and instantiated as determined herein. The object extent can indicate a size and/or volume of the object (e.g., a length, a width, and/or a height in meters). The object classification can indicate a classification and/or type of the object (e.g., a vehicle, a pedestrian, a bicyclist, etc.). The object pose can indicate an object's x-y-z coordinates (e.g., a position or position data) in the environment and/or can include a pitch, a roll, and/or a yaw associated with the object. The object trajectory can indicate a trajectory followed by the object. In some instances, the vehicle can predict a trajectory and the trajectory can include a predicted trajectory associated with the object. The object waypoint can indicate a position in the environment that indicates a route between two locations. For example, an object can travel from a location A to a location C through a waypoint B. The object instantiation attribute can indicate how the vehicle detected the object. In any such examples, contextual connotations determined using such waypoints can include a time to instantiate the object in simulation and/or destroy the object from simulation. For example, to instantiate, the object can enter a detection range of the vehicle by: (1) the vehicle approaching the object, (2) the object approaching the vehicle, and/or (3) the object becoming visible or an occlusion cessation of the object. The object termination attribute can indicate how the vehicle can no longer detect the object. For example, destruction can be associated with when the object is in a position outside of the detection range of the vehicle by: (1) the vehicle moving away from the object, (2) the object moving away from the vehicle, and/or (3) the object becoming occluded or an occlusion of the object.

The scenario generator can determine object attributes for none, some, or all of the objects to be included in the simulated scenario. As discussed above, the log data can include abnormalities and/or inconsistencies. For example, the log data can indicate that an object in the environment, such as a parked vehicle, can change an extent of the parked vehicle. The attributes component may use the determined object attributes, along with associated confidence data and/or distance measurement data, to generate updated attributes data values to improve the accuracy and resolve inconsistencies within the log data.

In some instances, the attributes component can determine that an attribute data value is inconsistent based on an attribute threshold. For purposes of illustration only, the log data can indicate that an object with a truck classification can have a z-axis attribute value of 0.5 meters indicating that the object is not in contact with the ground and is 0.5 meters above the ground. The attributes component can have a z-axis threshold of 0.2 meters and determine that the object has an inconsistent attribute as an object with a truck classification should not have a z-axis attribute value that meets or exceeds 0.2 meters.

In some instances, the attributes component can determine that an attribute is inconsistent based on a standard deviation calculation. For purposes of illustration only, the log data can indicate that an object with a pedestrian classification can have an extent that indicates a height of 2 meters at a first time, 2.1 meters at a second time, and 4 meters at a third time. The scenario generator can determine an arithmetic mean of 2.7 meters and a standard deviation of 0.92 meters. The scenario generator can be configured to have a threshold of one standard deviation and determine that the extent of 4d meters exceeds the single standard deviation threshold and determine that the extent of 4 meters is inconsistent. Other techniques for determining an inconsistent attribute are contemplated such as Z-Score, Dbscan, Isolation Forests.

The attributes component can determine updated attribute data values to replace the erroneous and/or inconsistent attribute data. The attributes component may determine updated attribute data values based on a distance between the object and the sensor(s) which captured the data from which the attribute data was initially determined. In some instances, the attributes component can determine updated attribute data values based on the distance measurement(s) between the object and the sensors at the time the sensor data was captured. In other instances, the attributes component can determine the update attribute data values based on distance measurements as well as separate confidence values associated with the attribute data. In still other instances, the attributes component may use the distance measurements between the object and the sensors to modify the confidence values, and then may use the modified confidence values to the determine updated attribute data values.

The updated object attribute data values can include, for example, an updated object size, position, classification type, pose, trajectory, velocity, waypoint, and the like. For purposes of illustration only, the attributes component may discard the extent of 4 meters and use a mean algorithm and replace the 4 meters with the mean of the remaining extent attribute data values (e.g., 2.05 meters). In some instances, the scenario generator can use a median algorithm and/or a mode algorithm. In some instances, the scenario generator can use smoothing algorithms such as Additive smoothing, Butterworth filters, Chebyshev filters, Exponential smoothing, Kalman filters, Kernel smoothers, Local regression, and/or moving averages, etc.

In some instances, the attributes component update attribute data values based on other attribute data associated with the same object and/or vehicle. By way of example and without limitation, the log data can indicate that an object is a parked vehicle while also having a velocity attribute associated with the object. The attributes component can determine that a parked vehicle having a velocity is inconsistent and may discard the velocity data associated with the parked vehicle object. In some instances, the log data can indicate that an object is associated with a semi-truck trailer object type (e.g., a classification) and that the object is associated with acceleration attributes that are inconsistent with a semi-truck trailer (e.g., the object accelerates too quickly for a vehicle of that amount of mass). Then the attributes component may discard the acceleration data associated with the semi-truck trailer object. In some instances, the attributes component can replace the inconsistent attribute data with updated attribute data values based on the classification (e.g., an average acceleration rate associated with a semi-truck trailer).

By replacing the inconsistent attribute values with updated attribute data values, the resulting simulation data can result in more a realistic and valuable simulation. For example, a simulated vehicle can traverse an environment begin to pass a parked vehicle in a parking lane. As the vehicle passes the parked vehicle, without the updated attribute data values, the extent of the parked vehicle could dramatically increase and cause a simulated collision with the vehicle. This would result in an unrealistic simulation and can consume computational resources without yielding productive simulation data.

The scenario generator can associate the instantiation attribute and/or the termination attribute with a trigger region in the simulated scenario. For example, the log data can indicate that the vehicle detected a pedestrian at a distance of 50 meters ahead of the vehicle as the vehicle traversed along a trajectory. The scenario generator can determine a trigger region based on the distance of 50 meters and instantiate the simulated pedestrian in the simulated environment when the simulated vehicle reaches the trigger region at 50 meters to the pedestrian (e.g., the contextual connotation described in detail above). In some instances, the scenario generator can determine a trigger region to increase a likelihood of interaction with an object. For purposes of illustration only, the log data can indicate that the pedestrian crosses in front of the vehicle at the distance of 50 meters to the pedestrian. The scenario generator can determine a trigger region of 5 meters to the pedestrian such that when the simulated vehicle crosses the trigger region, the simulated pedestrian will be instantiated 5 meters from the vehicle and cross the street to increase a likelihood of interaction with the simulated pedestrian and the simulated vehicle.

In some instances, the scenario generator can associate the termination attribute of a simulated object with a time threshold and/or a perception threshold. For purposes of illustration only, the scenario generator can determine a time threshold that can be 20 seconds and/or a perception threshold of 100 meters. During an execution of the simulated scenario, the scenario generator can determine a simulation parameter associated with the simulated object such as the amount of time that the object has been simulated in the scenario and/or a distance from the simulated vehicle. The scenario generator can determine that the simulation parameter has met or exceeded the time threshold and/or the perception threshold and destroy the object from the simulation.

By instantiating and terminating objects based on trigger regions and/or simulation parameters, the simulation of the vehicle controller can consume fewer computational resources by reducing the number of objects to simulate. Additionally, as the simulated vehicle traverses the simulated environment, the actions taken by objects can be tied to the behavior of the simulated vehicle rather than a specific time. For purposes of illustration only, the log data can indicate that a pedestrian crossed a sidewalk in front of the vehicle at a time $t_3$. In the simulated scenario, the simulated vehicle could perform a stopping action at time $t_1$ and not arrive at the crosswalk until time $t_4$. If the simulated pedestrian crossing the sidewalk is tied to a time, then the simulated pedestrian may have completed crossing the crosswalk before the simulated vehicle reaches the crosswalk. Instead, the action of the simulated pedestrian crossing the crosswalk can be associated with a trigger region and can increase the likelihood of the simulated vehicle interacting with the simulated pedestrian.

In some instances, the scenario generator can infer or determine an estimated trajectory associated with an object. For example, the log data can indicate that the vehicle did not detect a previous location or a later location of an object because the object was occluded. For purposes of illustration only, the vehicle can traverse an environment and arrive at an intersection with a crosswalk with a pedestrian waiting to cross the crosswalk. After the pedestrian crosses the crosswalk, the pedestrian can become occluded by an object such as a tree. When executed in a simulator, this can result in the simulated pedestrian stopping and no longer moving in the environment. The scenario generator can determine an estimated trajectory associated with the pedestrian to generate a more realistic scenario. For example, the scenario generator can determine the estimated trajectory based on a classification of the object, an observed trajectory (e.g., as represented in the log data), a velocity of the object, etc. For purposes of illustration only, after the simulated pedestrian crosses the crosswalk, the scenario generator can use the velocity attribute to determine that the simulated pedestrian can maintain a velocity and continue walking in the direction of travel indicated by the observed trajectory while still using, for example, an object controller to control the simulated pedestrian based on the simulated environment.

Within the simulated environment, motion of simulated objects can be initialized based on the log data, but can vary based on costs and/or waypoints associated with the simulated objects as the simulated objects react to a simulated autonomous vehicle or vehicle controller.

As noted above, the log data can include sensor data captured by one or more sensors of the vehicle or can include data based on such sensor data. For example, log data can include, but is not limited to, one or more of perception data indicating objects identified by one or more systems onboard the vehicle (or produced during a post-processing phase), prediction data indicating an intent of objects (whether produced during the recording or subsequent thereto), and/or status data indicating diagnostic information, trajectory information, and other information generated by the vehicle.

The vehicle can transmit the log data, via a network, to a database that stores log data and/or to a computing device executing a scenario generator and simulator (also referred to as a scenario generator). As discussed above, the log data can include perception data that identifies objects (e.g., roads, sidewalks, road markers, signage, traffic lights, other vehicles, pedestrians, cyclists, animals, etc.) and/or bounding boxes that represent the objects. The scenario generator can use the log data to generate simulation instructions to simulate a scenario. For example, the environment (e.g., roads, buildings, signage, etc.) traversed by the vehicle can be represented as a simulated environment in the simulated scenario. The simulated scenario can be identical to the captured environment or deviate from the captured environment. For example, the simulated environment can have more or fewer number of buildings as in the captured environment. Additionally, objects (e.g., other vehicles, pedestrians, animals, cyclists, etc.) in the log data can be represented as simulated objects and the vehicle can be represented as a simulated vehicle. In at least some examples, such simulated data may comprise only information about static and dynamic entities (e.g., exclusive of buildings, roads, etc.). In such examples, the simulated environment may comprise previously generated (or otherwise available) maps and/or representations of the recorded environment.

The simulated vehicle can represent an autonomous vehicle that is controlled by an autonomous controller that can determine a trajectory, based at least in part, on the simulated environment. In such an example, the same and/or similar systems may be tested in software and/or hardware.

The log data can include an event of interest. In some instances, an event of interest can include detecting a collision with another object, a violation of a traffic rule (e.g., a speed limit), and/or a disengagement where a human driver takes control of the operation of the vehicle from an autonomous controller. In some instances, an event of interest can include an error condition and/or a warning such as a low battery power event. Further, an event of interest can include a lane change, a change of direction (of object(s) in the environment), a change in velocity (of object(s) in the environment), and the like.

In some instances, the vehicle computing device can be configured to detect a safety concern and/or an uncertainty and transmit a request, in addition to the status data, to a remote computing device associated with a teleoperator. The teleoperator can assess the situation and provide guidance to the vehicle. After receiving the guidance (and/or a command, in general), the vehicle can continue operation in order to achieve a safe outcome in response to the event of interest. For example, an object can block a roadway that can lead to the vehicle determining a different route from a preplanned route or a teleoperator can provide the guidance to respond to the blockage. In some instances, the vehicle can generate an event marker in the log data that provides an indication that an event of interest occurred at a particular time. Then, the scenario generator can select the log data, by identifying the event of interest and/or by identifying the event marker. Using the log data and/or the event, the scenario generator can generate simulation instructions that can be used to execute a simulated scenario by representing the captured environment in the simulated scenario along with simulated objects.

In some instances, the scenario generator can identify a portion of the log data to use to generate the simulated scenario. For example, the scenario generator can identify a portion of the log data prior to the event that corresponds to a period of time (e.g., 20 seconds) and another portion of the log data following the event that correspond to another period of time (e.g., 10 seconds). In some instances, the scenario generator can use a default period of time and/or the scenario generator can use a user configurable period of time.

The scenario generator can execute the simulated scenario and generate simulation data that indicates how an autonomous controller and/or other objects would respond given the simulated scenario. For example, the simulation data can include control output generated by the simulated autonomous controller. Additionally, the simulation data can indicate how objects would respond given the simulated scenario. For example, the scenario generator can represent the vehicle as a simulated vehicle that traverses the simulated environment using an autonomous controller. In some instances, the simulated vehicle can be controlled using a controller that is the same as or that is different than the controller used by the vehicle that generated the log data. In a scenario where a simulated controller is different than a controller used to capture the log data, the simulated vehicle can perform actions that deviate from the vehicle as represented in the log data. For purposes of illustration only, a simulated controller may represent different planning algorithms or driving behaviors (e.g., different acceleration or braking profiles) that may introduce differences between the log data and simulated data. Additionally, in the event that the vehicle which collected the data was manually operated (even for a small portion of time), there may be the same discrepancies between the actual log data and how the data would evolve given the autonomous vehicle controller.

In some instances, the scenario generator can determine the actions of a simulated object in the simulated environment based on the log data. For example, the simulated object can perform actions associated with the object as represented in the log data. In some instances, the scenario generator can associate a controller with the simulated object, where the controller can determine trajectories for the object that deviate from the log data. Thus, the simulated object can perform actions associated with the object as represented in the log data and/or perform actions that deviate from the object as represented in the log data. Thus, the simulated object can intelligently react to deviations in the behavior of the simulated vehicle. For purposes of illustration only, in a scenario where a simulated object is following a simulated vehicle, if the simulated vehicle begins braking sooner or more aggressively than the braking behavior represented in the log data, the simulated object may modify its trajectory by braking sooner or changing lanes, for example, to avoid a collision or near-collision with the simulated vehicle.

In some instances, the controller associated with the simulated vehicle can be the same controller associated with the simulated objects. In some instances, the scenario generator can associate a controller with the simulated vehicle that is different from the controller associated with the simulated objects. In some instances, the scenario generator can determine a difference between actions performed by the object as represented in the log data and actions performed by the simulated object in the simulation data.

The techniques discussed herein can improve a functioning of a computing device by reducing an amount of required computational resources. For example, updated attribute data values may be used to generate improved synthetic data for simulations and simulated environments, which may improve the accuracy and value of simulations. Additionally, an attributes component and/or scenario generator may determine trigger regions associated with a simulated object. When a simulated vehicle interacts with a trigger region (e.g., crosses a trigger region), the simulation may instantiate a simulated object in the simulated environment. Rather than instantiate all objects of the simulated environment, the scenario generator can instantiate the objects as the simulated vehicle reaches certain trigger regions to instantiate objects which can reduce the amount of computational resources (e.g., processing resources, memory resources, etc.) required to execute the simulated environment.

Therefore, the functioning of a computing device can be improved by increasing the computing device's ability to determine updated and improved object attribute data, including realistic sizes, classification types, positions, trajectories and behaviors of simulated objects in an environment. Determining appropriate velocities and trajectories for a vehicle can improve safety outcomes, particularly in the context of autonomous vehicle by, for example, producing more realistic reactions to adaptations in vehicle behavior in an environment. Thus, the techniques described herein can improve a functioning of a computing device as well as improve safety outcomes.

The techniques described herein can be implemented in a number of ways. Example implementations are provided below with reference to the following figures. Although discussed in the context of an autonomous vehicle, the techniques described herein can be applied to a variety of systems requiring control and/or interaction with objects in an environment, and is not limited to autonomous vehicles. In another example, the systems, methods, and apparatuses can be used in an aviation or in a nautical context. Additionally, the techniques described herein can be used with real data (e.g., captured using sensor(s)), simulated data (e.g., generated by a simulator), or any combination of the two.

FIG. 1 illustrates a pictorial flow diagram 100 that depicts an environment 102 through which vehicle(s) 104 are traveling. The vehicle(s) 104 can include a computing device that includes a perception component that can perform operations such as detecting, identifying, segmenting, classifying, and/or tracking objects from sensor data captured in the environment 102. For example, the computing device associated with vehicle(s) 104 can detect objects 106(1), 106(2), and 106(3). While objects 106(1), 106(2), and 106 (3) are depicted as vehicles in environment 102, objects 106(1), 106(2), and 106(3) can also include cyclists, pedestrians, animals, road markers, signage, traffic lights, buildings, mailboxes, and/or other objects.

The vehicle(s) 104 can traverse through the environment 102 and determine and/or capture data. For example, the vehicle computing device can determine vehicle status data, vehicle diagnostic data, vehicle metrics data, and/or map data. In some instances, the vehicle(s) 104 can include one or more sensors where the one or more sensors can include one or more time-of-flight sensors, lidar sensors, radar sensors, sonar sensors, image sensors, audio sensors, infrared sensors, location sensors, wheel encoders, IMUs, etc., or any combination thereof, although other types of sensors are contemplated.

As the vehicle(s) 104 traverses through the environment 102, the sensors can capture sensor data associated with the environment 102. For example, and as discussed above, some of the sensor data can be associated with objects (e.g., vehicles, cyclists, pedestrians, etc.). In some instances, the sensor data can be associated with other objects including, but not limited to, buildings, road surfaces, signage, barriers, etc. Therefore, in some instances, the sensor data can be associated with dynamic objects and/or static objects. The dynamic objects can be objects that are associated with a movement (e.g., vehicles, motorcycles, cyclists, pedestrians, animals, etc.) or capable of a movement (e.g., parked vehicles, standing pedestrians, etc.) within the environment 102. The static objects can be objects that are associated with the environment 102 such as, for example, buildings/structures, road surfaces, road markers, signage, barriers, trees, sidewalks, etc. In some instances, the vehicle computing device can determine information about objects in the environment, such as bounding boxes, classifications, segmentation information, and the like.

The vehicle computing device can use the sensor data to generate a trajectory for the vehicle(s) 104. In some instances, the vehicle computing device can also determine pose data associated with a position of the vehicle(s) 104. For example, the vehicle computing device can use the sensor data to determine position data, coordinate data, and/or orientation data of the vehicle(s) 104 in the environment 102. In some instances, the pose data can include x-y-z coordinates and/or can include pitch, roll, and yaw data associated with the vehicle(s) 104.

The vehicle computing device can generate log data 108. For example, the log data 108 can include the sensor data, perception data, planning data, vehicle status data, velocity data, intent data, and/or other data generated by the vehicle computing device. In some instances, the sensor data can include data captured by sensors such as time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor data can be data captured by such sensors such as time-of-flight data, location data, lidar data, radar data, sonar data, image data, audio data, etc. In some instances, the log data 108 can include time data that is associated with the other data generated by the vehicle computing device.

The log data 108 can represent various states of the environment 102 along a timeline. A state, as shown in FIG. 1 can comprise various representations of an environment (a real environment, an environment as represented by captured sensor data, data based on captured sensor data (e.g., bounding boxes, object classifications, planner decisions, and/or an environment as represented by a simulator) at individual time points or over time. For example, the log data 108 can represent a state 110 of the environment 102 at a time $t_0$ 112. In some instances, the state 110 can be an initial state of the environment 102 that is associated with a beginning (or an arbitrary) portion of the log data 108. In some instances, the state 110 can be a state of the environment 102 that is associated with an arbitrary (e.g., middle) portion of the log data 108. The log data 108 can represent a state 114 of the environment 102 at a time $t_1$ 116 that is after the time $t_0$ 112. As depicted in FIG. 1, the log data 108 can represent a state 118 of the environment 102 at a time $t_2$ 120 that is after the time $t_0$ 112 and $t_1$ 116. For purposes of illustration only, the state 110 can represent the environment 102 at an initial time $t_0$ 112 at 0 seconds, the state 114 can represent the environment 102 at a later time $t_1$ 116 at 5 seconds, and the state 118 can represent the environment 102 at a later time $t_2$ 120 at 15 seconds. Therefore, in some instances, the times $t_0$ 112, $t_1$ 116, and $t_2$ 120 can be nonsequential (e.g., with an elapsed time in between the times $t_0$ 112, $t_1$ 116, and $t_2$ 120) or the times $t_0$ 112, $t_1$ 116, and $t_2$ 120 can be sequential (e.g., without an elapsed time in between the times $t_0$ 112, $t_1$ 116, and $t_2$ 120).

The vehicle(s) 104 can transmit the log data 108 or a portion of the log data 108 to a computing device(s) 122 via network 124. For example, the vehicle(s) 104 can transmit log data 108 that includes time data, perception data, and/or map data to the computing device(s) 122 to store the log data 108. Examples of data generated by a vehicle that can be included in the log data 108 can be found, for example, in U.S. patent application Ser. No. 15/644,267 titled "Interactions Between Vehicle and Teleoperations System" and filed Jul. 7, 2017 (describing, in part, communication signals that can include sensor data and data indicating an occurrence of an event as well vehicle control data that can be derived from data received from a sensor and a planner, an object data calculator, an object classifier, a collision predictor system, a kinematics calculator, a safety system actuator, and a control operation of the drive system), U.S. patent application Ser. No. 15/693,700 titled "Occupant Protection System Including Expandable Curtain and/or Expandable Bladder" and filed Sep. 1, 2017 (describing, in part, data representative of a trajectory of the vehicle, location data, object data, and vehicle control data), and U.S. patent application Ser. No. 16/198,653 titled "Executable Component Interface and Controller" filed Nov. 21, 2018 (describing, in part, a type of log data), which are each incorporated by reference in their entirety. In some instances, the computing device(s) 122 can include a server that stores the log data 108 in a database. In some instances, the computing device(s) 122 can operate a scenario generator. Such transmission can be wired, wireless, or otherwise, as described in detail herein.

In some instances, the vehicle(s) 104 can be operated remotely by a person. For example, while traversing the environment 102, the vehicle(s) 104 can encounter an event of interest that is unpredictable in nature, represents safety concerns, and/or requires responses to spontaneous visual cues or direction from, for example, police officers or construction workers. The vehicle(s) 104 can be configured to detect that an uncertainty associated with an action (e.g., by determining confidence level(s) associated with a maneuver and/or event). Upon identifying such uncertainty, the vehicle(s) 104 can send a request to a teleoperations device to obtain guidance to resolve the uncertainty and proceed.

Following the request to the teleoperations device, a user interface can quickly and accurately apprise the teleoperator of the situation. In some instances, the vehicle(s) 104 can transmit log data 108 (e.g., sensor data captured by sensors and/or operation state data) with the request. In response to the request, a teleoperator can provide guidance (which may sometimes be referred to as a command, or otherwise information, such as, but not limited to, disregard certain policies, a path to try and follow, or the like) to the vehicle(s) 104. In some instances, the teleoperations device can determine the guidance based at least on the request, sensor data, and/or vehicle state data. In some instances, the vehicle state data can indicate a light status of the vehicle, a door status of the vehicle, a battery status of the vehicle, etc.

The vehicle(s) 104 can be configured to generate an event marker associated with the request to the teleoperations device. In some instances, the vehicle(s) 104 can determine an event of interest and generate an event marker associated with the event of interest without sending a request to the teleoperations device. For purposes of illustration only, the vehicle(s) 104 can use a sensor to detect a sudden braking event. For example, the vehicle(s) 104 can determine that an amount of acceleration meets or exceeds a threshold to detect the sudden braking event. The vehicle(s) 104 can be configured to associate sudden braking events as an event of interest and generate an event marker associated with the sudden braking event. In some instances, the vehicle(s) 104 can generate a log of events of interest in the log data 108 that indicates a type of event of interest as well as a timestamp associated with the event of interest. In some instances, the vehicle(s) 104 can generate an event marker that indicates a time in the log data 108 when the event of interest occurred.

After receiving the log data 108 at the computing device(s) 122, a scenario generator executing on the computing device(s) 122 can determine an event associated with the log data 108. For example, the vehicle(s) 104, while traversing the environment 102, can determine a lane change action as an event of interest. The vehicle(s) 104 can then transmit the log data 108 to the computing device(s) 122. At the computing device(s) 122, the scenario generator can identify the log data 108 that includes an event of interest by, for example, scanning through the log data 108 for an event of interest and/or my identifying an event marker. In some examples, the log data 108 can be sent to the computing device(s) 122 whereby the computing device(s) 122 can search the log data 108 to determine one or more events (e.g., braking associated with a deceleration above a threshold value, pedestrians crossing a crosswalk, navigating around double-parked vehicles, and the like).

Based on the log data 108, the scenario generator can identify objects represented in the log data 108. Then the scenario generator can determine portions of the log data 108 that are associated with the objects. For example, the scenario generator can identify the object 106(1) that is a vehicle in the environment 102 that is represented in the log data 108 at state 110. The scenario generator can identify the object 106(1) that is represented in the log data 108 at states 114 and 118. In some instances, the log data 108 can include perception data that can include, or can be based on, sensor data from a sensor or a combination of sensors of vehicle(s) 104. In some instances, the perception data associated with the object 106(1) can include, for example, an extent of the object 106(1) and/or distance measurements between the sensor(s) of the vehicle(s) 104 and the object 106(1). In some examples, the log data 108 also can include track data associated with the object 106(1) that identifies a movement of the object 106(1) in the environment 102 (e.g., output of data association between subsequent times of data acquisition associating new data with previous data about the object).

Using the perception data, distance measurements, and/or the track data, the scenario generator can determine a log data attributes table 126 that identifies attributes associated with one or more objects of the environment 102 at various times of the log data 108. For example, object 1 of the log data attributes table 126 can be object 106(1) and be associated with attributes 128(1), 128(2), and 128(3); object 2 of the log data attributes table 126 can be object 106(2) and be associated with attributes 130(1), 130(2), and 130(3); and object 3 of the log data attributes table 126 can be object 106(3) and be associated with attributes 132(1), 132(2), and 132(3). In some instances, the attributes can indicate one or more extent(s) of the object (e.g., a length, width, height, etc.), a position of the object, a pose of the object, a velocity of the object, a classification type of the object, a trajectory of the object, an instantiation attribute of the object, and/or a termination attribute of the object.

In some instances, the instantiation attribute can indicate a manner in which the vehicle(s) 104 detect the object and/or an initial perception of the object. For purposes of illustration only, the object 106(1) can enter a detection range of the vehicle(s) 104 by the vehicle(s) 104 approaching the object 106(1), by the object 106(1) approaching the vehicle(s) 104, and/or the object 106(1) becoming visible (e.g., the object 106(1) can be behind an occluding object such as a building and the vehicle(s) 104 and/or the object 106(1) can move to a position where the occluding object no longer occludes the object 106(1), also referred to as an occlusion cessation). In some instances, the detection range (also referred to as a perception threshold) can be associated with a capability of the one or more sensors of the vehicle(s) 104. In some instances, the detection range can be associated with a confidence value that is determined by a perception component of the vehicle(s) 104.

In some instances, the termination attribute can indicate a manner in which the vehicle(s) 104 can no longer detect the object and/or an updated perception of the object. For purposes of illustration only, the object 106(1) can be in a position outside of the detection range of the vehicle(s) 104 by the vehicle(s) 104 moving away from the object 106(1), by the object 106(1) moving away from the vehicle(s) 104, and/or the object 106(1) becoming occluded (e.g., the object 106(1) can move to a position behind an occluding object such as a building).

For purposes of illustration only, the log data attributes table 126 can indicate that object 1 traveled at a velocity of 5 meters/second (m/s) at a time $t_0$, traveled at a velocity of 4.8 m/s at a time $t_1$, and traveled at a velocity of 4.5 m/s at a time $t_2$. In some instances, the attributes component can determine inconsistencies in the log data attributes table 126 and determine updated attribute data values, based on confidence values and/or distance measurements associated with the attribute data determined for the object. For purposes of illustration only, the log data attributes table 126 can indicate that the object 1 traveled at a velocity of 5 meters/second (m/s) at a time $t_0$, traveled at a velocity of 55 m/s at a time $t_1$, and traveled at a velocity of 4.5 m/s at a time $t_2$. The attributes component can determine that the velocity at $t_1$ is inconsistent and determine an updated attribute data value for the velocity of the vehicle at $t_1$.

In some instances, the attributes component can determine that certain attribute data is inconsistent based on an attribute threshold. For purposes of illustration only, the attributes component can determine that a velocity of 55 m/s meets or exceeds a velocity threshold. In some instances, the attributes component can determine that, for purposes of illustration only, a change in an extent attribute associated with an object exceeds an extent change threshold. In some instances, the attributes component may determine that an attribute is inconsistent based on an attribute threshold and a different attribute. For purposes of illustration only, the attributes component may determine that a velocity threshold for a pedestrian classification of an object is lower than the velocity threshold for a vehicle classification for an object. In some instances, the attributes component can determine that the velocity threshold for a vehicle is higher on a highway road surface than the velocity threshold for a vehicle on a road surface within a school zone. In some instances, the attributes component can use a standard deviation to determine that an attribute is inconsistent, although other suitable algorithms and techniques are contemplated.

In some instances, the attributes component may determine updated attribute data values to replace the erroneous and/or inconsistent attribute data in the log data attributes table 126. In some instances, the attributes component can generate an updated attribute data value table instead of, or in addition to, replacing the values of the log data attributes table 126 The attributes component can determine an estimated attribute using an estimation algorithm. In some instances, the estimation algorithm can include an averaging algorithm. For purposes of illustration only, the log data attributes table 126 can indicate that the object 1 has a length attribute of 4.5 meters at a time $t_0$, a length attribute of 8 meters at a time $t_1$, and a length attribute of 4.6 meters at a time $t_2$. (Of course, in some examples, an extent attribute may correspond to a width or height, or any combination thereof, and is not limited to length). The attributes component can determine that the extent (e.g. size) attribute associated with the object 1 at $t_1$ is inconsistent and may discard and/or ignore the extent attribute data value and may determine an updated extent attribute data value, based on the confidence values and distance measurements associated with the attribute data.

In some instances, the attributes component can use an estimation algorithm to replace all of the attribute data values of a type of attribute associated with an object. For purposes of illustration only, the attributes component can replace the extent attribute values associated with object 1 at times $t_0$, $t_1$, and $t_2$ with 4.55 meters. As can be understood, in some instances, the length of an object such as a vehicle can be assumed to be consistent in the environment 102 and a simulated environment generated by the scenario generator.

Based on the log data 108, the log data attributes table 126, and/or an estimated attributes table (e.g., described in connection with FIGS. 2-4, as well as throughout this disclosure), the scenario generator can generate simulation instructions 134 that describe a simulated scenario that includes a simulated environment. For example, the log data 108 can include map data and location data indicating a region such as environment 102 and how the vehicle(s) 104 traversed through the region. Additionally, the log data 108 can include status data of the vehicle(s) 104, including but not limited to acceleration data, steering angle data, indicator status data, etc. as the vehicle(s) 104 traversed through the region. The log data 108 can include time data that associates actions of the vehicle(s) 104 and observations (e.g., sensor data) with a set of timestamps. The log data 108 can be used by the scenario generator to generate the simulation instructions 134 that, when executed, can generate simulation data that that represents the environment 102 and include simulated objects at various states. For example, the simulation data can represent a state 136 of the simulated environment at a time $t_x$ 138, a state 140 of the simulated environment at a time $t_y$ 142 that is after the time $t_x$ 138, and a state 144 of the simulated environment at a time $t_z$ 146 that is after the time $t_y$ 142.

In some instances, the scenario generator can create simulation instructions that represent the simulated environment that includes more or less detail from environment 102 as depicted in FIG. 1 (e.g., by filtering out objects or by adding additional objects).

As discussed above, the scenario generator can execute the simulation instructions and generate simulation data. The simulation data can indicate how an autonomous controller associated with a simulated vehicle responded under the circumstances presented in the simulated scenario as well as how the simulated objects responded.

In some examples, an attributes component may determine the attribute data (also referred to as attribute value(s)) for the objects detected in an environment, based at least in part on confidence values and/or based on the distances between the objects and the sensors used to detect to the objects. The attributes component may include one or more specialized hardware or software components operating within vehicle 104, computing device(s) 122, and/or other computer systems. The attributes component may receive log data, including sensor data and/or additional data determined based on sensor data captured by one or more sensors within an environment. The log data may be based on sensor data captured by a vehicle operating in a physical environment, and as discussed above the log data may be used to generate simulation instructions for simulated environments. The log data may include data identifying various static and/or dynamic objects within the environment, and various attribute data associated with each object. The attribute data for an object may include specific attribute values determined for object attributes such as object size, position, classification type, pose, velocity, trajectory, etc.

Along with the attribute data for an object, the attributes component also may receive confidence values and/or distance measurements associated with the attribute data. In some examples, the confidence values and/or distance measurements may be included within the log data, or may be received or determined separately by the attributes component. The confidence values may indicate a level of confidence in the accuracy of the attribute data for the object. For purposes of illustration only, attribute data classifying an object as a bicycle may have a confidence value of 95%, indicating a 95% level of confidence that the object is indeed a bicycle and 5% level of confidence that the object is something other than a bicycle. Distance measurements associated with attribute data for an object may be measurements of the distance between the object and the sensor(s) that detected the object, at the time the object was detected. For purposes of illustration only, the 95% confidence value classification of the object as a bicycle may have an associated distance measurement of 10 meters, indicating that the object was 10 meters from the sensor (e.g., vehicle 104) at the time the sensor data was collected from which classification determination of bicycle was made.

In some examples, distance data and/or confidence data can be used to weight individual attribute data when aggregating attribute data to determine updated attribute data. For instance, distance measurements between the object 106 and the sensor(s) from which the attribute data was captured (or which the attribute data was based on) may be used to upweight or downweight the attribute data, to arrive at more accurate updated attribute data. By way of example only, the attributes component may apply a distance-biasing function (e.g., an exponential decay function) to the confidence values associated with attribute data values. Distance-biased confidence values then may be averaged and/or compared for different attribute data values, to determine the updated attribute data values.

As noted above, the attribute data associated with objects may be determined based on the confidence values and/or distance measurements associated with the attribute data. The attributes component may receive one or multiple initial attribute data values associated with an object, for one or more multiple attribute types. The initial attribute data values may be included within the log data, and/or may be determined by the attributes component based at least in part on the log data. The attributes component also may receive or determine associated times (e.g., object detection times), confidence values, and/or distance measurements associated with each of the initial attribute data. Using the received data, the attributes component may determine updated attribute data values using various techniques, which may be performed individually or in combination. For example, the attributes component may use both confidence values and distance measurements to determine updated attribute data values, for example, by weighting or modifying the initial attribute data values. In other examples, the attributes component may update an initial set of confidence values received for the attribute data, based on the distance measurements associated with the attribute data, and then may use the updated confidence values to determine or modify the attribute data. In still other examples, the attributes component need not receive any initial confidence values, but may determine the confidence values for attribute data based on the associated distance measurements and/or other log data, and then may use the confidence values to determine or modify the attribute data.

After determining the updated attribute data values for the objects detected in the environment, based on the confidence values and/or distance measurements, the attributes component may store the updated attribute data values for use in one or more subsequent computer operations. For example, updated attribute data values may be used to generate improved synthetic data for simulations and simulated environments. In other examples, the updated attribute data values may be used to control the operation of a vehicle (e.g., an autonomous or manually controlled vehicle) driving in the environment.

The techniques described herein for updating attribute data for objects in an environment may apply to single attribute data value determined for an object at a single point in time, or to associated sets of multiple attribute data values determined for an object at multiple different times during a time window. For instance, a single object 106 may be detected within an environment 102, at a single point in time 112 by the sensors of a vehicle 104. For purposes of illustration only, the sensor data captured at time 112 may be analyzed to determine that the classification/type attribute for object 106 has an attribute data value corresponding to a car, and that a length attribute for object 106 has an attribute data value of 5.1 meters, etc. As this example illustrates, each individual attribute data value may be associated a single object 106, a single attribute of the object, and a single point in time 112. As discussed above, each individual attribute data value also may have an associated confidence value and/or distance measurement. In some examples, when the attributes component receives data associated with only a single individual attribute data value, it may update or modify the confidence value associated the individual attribute data value, but might not determine an updated attribute data value. For instance, the attributes component may use the distance measurement between the vehicle 104 and object 106 at the same point in time to determine or update the confidence value for the individual attribute data value. The confidence values associated with attribute data, even for individual attribute data values, may be used to determine if and how the object and determined attribute data is used for generating simulation scenarios, controlling the vehicle, and for other purposes. For instance, the scenario generator may omit objects from a simulated scenario, or a vehicle control system may reduce reliance on an object attribute, when a confidence level for the object classification/type, size, or other attribute is below a confidence threshold level.

In other examples, when the attributes component receives data including multiple attribute data values for an object determined at multiple different times across a time period, the attributes component may determine updated confidence values and/or updated attributes data by analyzing the set of associated attribute data across the time period. For instance, as discussed above in FIG. 1, a vehicle 104 may drive through an environment 102 and may detect an object 106 at multiple different times 112, 116, 120, etc. At each separate time, the sensor data captured at that time may be analyzed and used in conjunction with other data to determine attribute data values for the object 106. In some examples, a sequence of object attribute data may be determined for an object 106, at multiple different times as the vehicle moves through the environment 102, staring with an initial detection time at which the object 106 is first detected by the sensors of the vehicle 104, and ending at final detection time after which the object 106 is no longer detected by the sensors of the vehicle 104. Sequences of object attribute data may include many multiple attribute data values (e.g., hundreds or even thousands) associated with the same object 106 and the same attribute of the object, where each attribute data value is corresponds to a different point in time within the log data.

Within a sequence of object attribute data, certain attribute data values may be inconsistent and/or contradictory with other attribute data values, indicating an error in at least one of the attribute data values. For example, as vehicle 104 proceeds through environment 102 detecting and capturing sensor data for an object 106, the data captured at different times may have different detection distances and angles, different light conditions, and/or different occlusions between the vehicle 104 and object 106. These factors and others may vary over time, causing the differences in the attribute data determined for an object 106 at different times 112, 116, 120, etc. For purposes of illustration only, an object 106 may be classified as a car at a first time 112, and a truck at a second time 116, or may be classified as a larger size at the first time 112 and a smaller size at the second time 116, etc.

The differences or inconsistencies between attribute data values for an object 106 at different times may or may not indicate errors or inaccuracies in the sensor data or the attribute data determinations. For example, for dynamic objects such as moving vehicles, pedestrians, animals, bicyclists, motorcycles, etc., changes in attribute data for changeable attribute types (e.g., position, velocity, yaw, trajectory, etc.) may be the result of movement of the object. However, for static objects such as buildings, trees, signs, and parked cars, and/or for non-changing attribute types (e.g., object classification type, object size, etc.), changes in attribute data at different points in time may indicate errors in the sensor data and/or the attribute data determinations based on the sensor data.

Figure 2A:
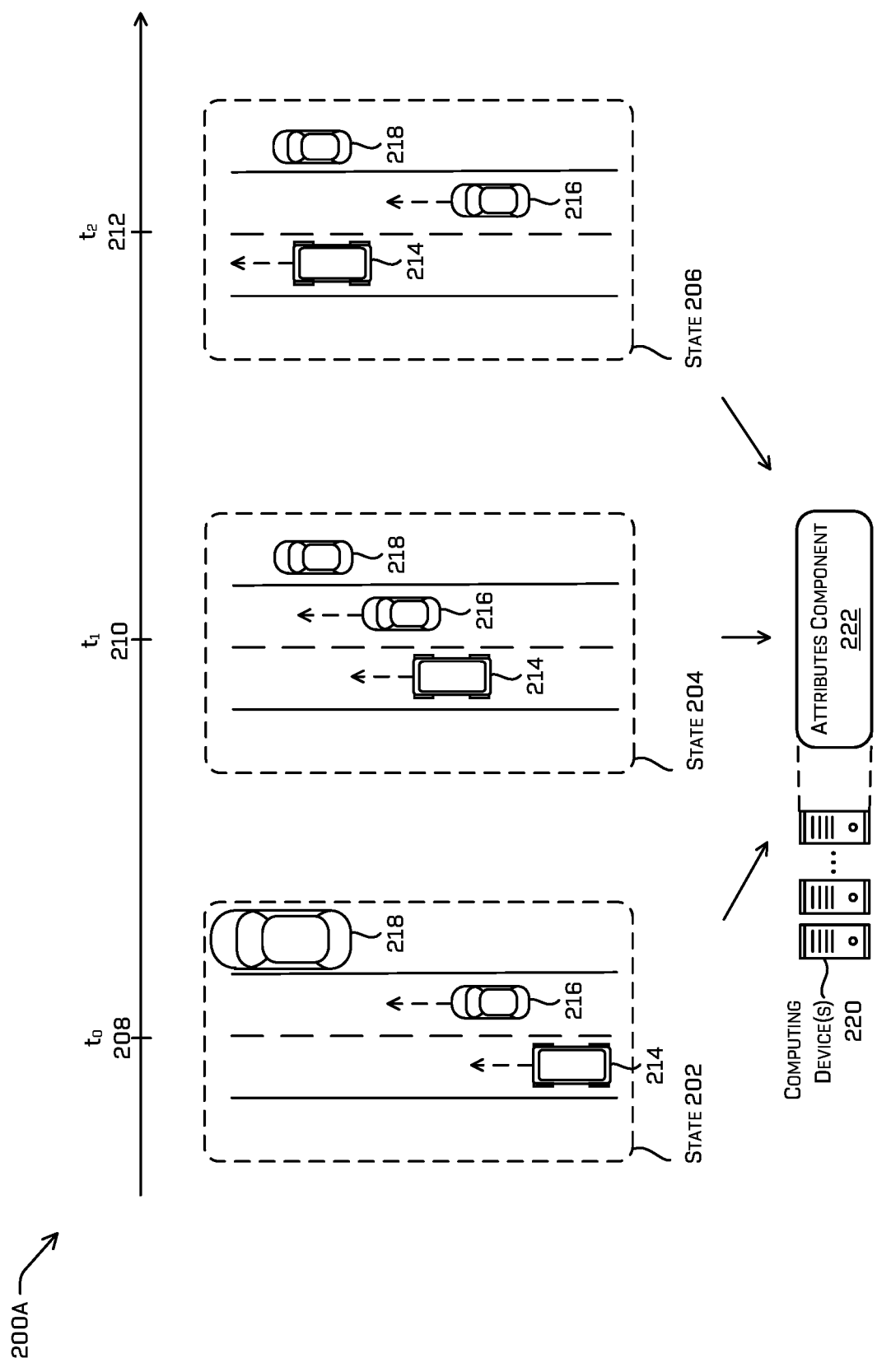
FIGS. 2A and 2B depict the collection of sensor data by a vehicle in an environment, including attribute data for objects at multiple instances of time.
Figure 2B:
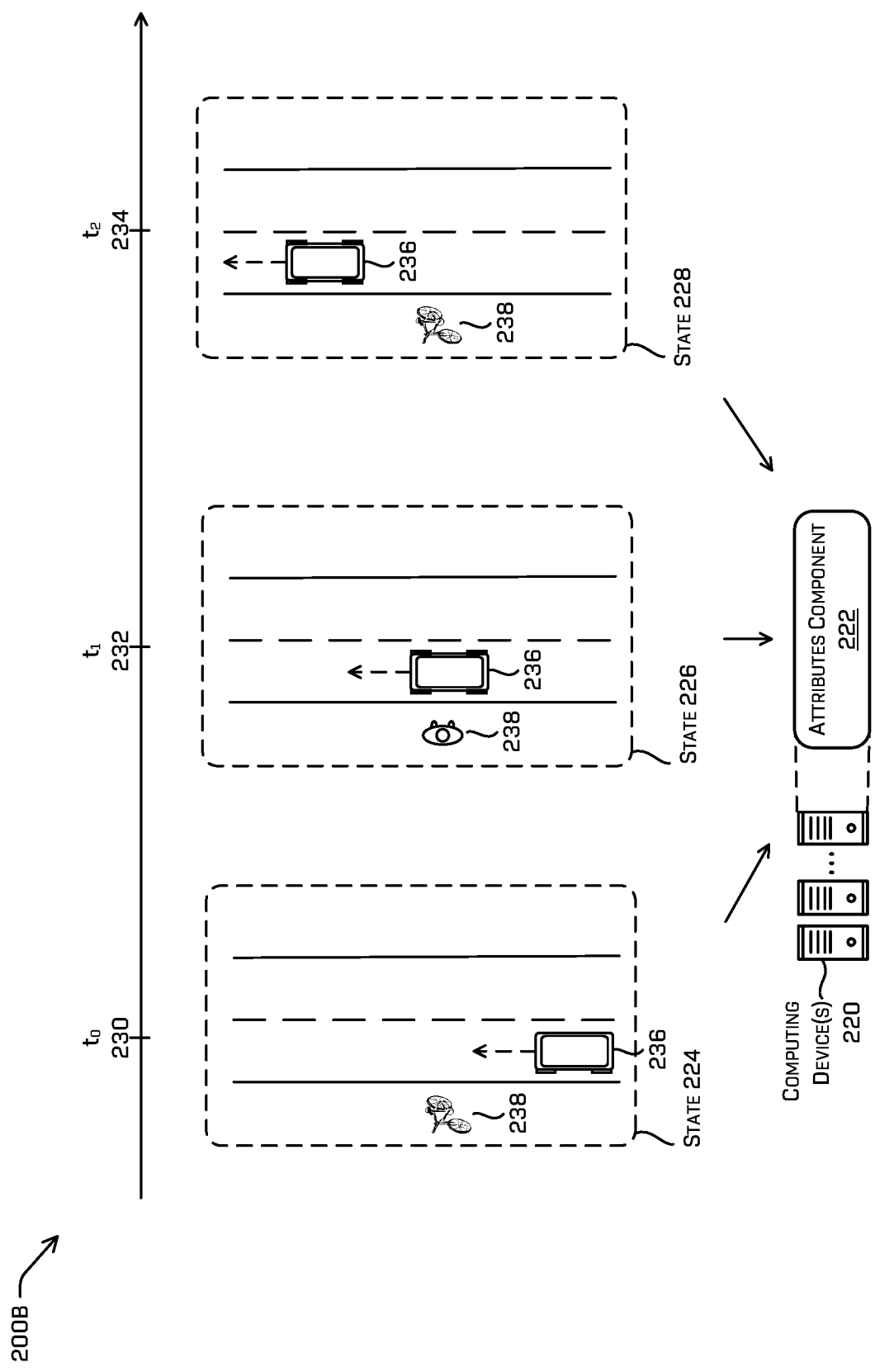

FIGS. 2A and 2B illustrate two examples 200A and 220B that depict scenarios in which a vehicle moving through an environment may capture sensor data from an object, and use the sensor data to determine different object attribute data at different times while moving through the environment.

The scenario depicted in example 200A may be based on log data collected by a vehicle 214 while moving through an environment at times $t_0$ 208, $t_1$ 210, and $t_2$ 212. Within the log data, states 202, 204, and 206 of the environment are associated respectively with times $t_0$ 208, $t_1$ 210, and $t_2$ 212. At each of times $t_0$ 208, $t_1$ 210, and $t_2$ 212, data may be captured using the sensors on the vehicle 214, and the resulting log data, represented by states 202, 204, and 206, may indicate a number of objects and associated attribute data for the objects detected at those respective times. For instance, at time $t_0$ 208, the state 202 may represent a vehicle 214 as traversing the environment with an object 216 (e.g., a dynamic object such as a different vehicle) in a driving lane to the right of vehicle 214 and another object 218 (e.g., a static object such as a parked vehicle) in a parking lane. At a time $t_1$ 210 that is after time $t_0$, the state 204 can represent the vehicle 214 as traversing the environment and passing object 216. At a time $t_2$ 212 that is after times $t_0$ and $t_1$, the state 206 can represent the vehicle 214 as traversing the environment and completing a pass of object 216. By way of example and without limitation, FIG. 2A depicts object 216 as partially obscuring the vehicle 214 from detecting object 218.

The vehicle 214 (which can be similar to vehicle 104) may store and/or transmit the log data to computing device(s) 220. In some examples, the computing device(s) 220 may execute a scenario generator, and may be similar to the computing device(s) 122 described above with respect to FIG. 1.

As discussed above, an attributes component 222 executing on the computing device(s) 220 (and/or on the vehicle 214) may determine attribute data associated with the objects 216 and/or 218. An attribute of an object can indicate an extent of the object, a pose of the object, a velocity of the object, a classification of the object, a trajectory of the object, an instantiation attribute of the object, a termination attribute of the object, and the like. In some instances, the attributes component 222 can determine an inconsistency in the attributes associated with the objects 216 and/or 218. As depicted in FIG. 2A, and for purposes of illustration only, state 202 may represent the object 218 having a first extent (e.g., size). At state 204, the object 218 can be represented as having a second extent that is different from the first extent. At state 206, the object 218 can be represented as having a third extent that is the same as the second extent but different from the first extent. Additionally, as depicted it FIG. 2A and for purposes of illustration only, the state 204 can represent the object 216 in a first position and the state 206 can represent the object 216 associated with a second position that is behind the first position.

In some examples, attributes component 222 can determine that an attribute associated with the object 218 is inconsistent using a change threshold for the attribute. For purposes of illustration only, the extent of the object 218 can decrease from state 202 to state 204 by 50% and an extent change threshold may be 5%. In this case, the attributes component may determine that the extent associated with the object 218 has changed by equal to or more than 5% and determine that the extent attribute is inconsistent. In some instances, the attributes component can use a standard deviation to determine that the extent attribute is inconsistent.

Additional or alternatively, the attributes component can use other log data to determine inconsistencies in attribute data. For instance, the attributes component 222 can determine that the position attribute of the object 216 is inconsistent based on the velocity attribute of the object 216 determined at times 208, 210, and 212. In this example, the attributes component 222 may determine that, because the object 216 traveled at the velocities indicated in the log data, that it would be at a position in the environment that is different from the position indicated at state 206.

The second scenario depicted in example 200B may be based on log data collected by a second vehicle 236 while moving through an environment. At each of times $t_0$ 230, $t_1$ 232, and $t_2$ 234, data may be captured using the sensors on the vehicle 236, and the resulting log data, represented by states 224, 226, and 228, may indicate the objects and associated attribute data at those respective times. For instance, at time $t_0$ 230, the state 224 may represent a vehicle 236 as traversing the environment with an object 238 stationary on the shoulder of the road to the left of vehicle 236. At time $t_1$ 232 the state 226 may represent the vehicle 236 as traversing the environment and passing object 238, and at time $t_2$ 234 the state 228 may represent the vehicle 236 as having passed object 238. At each time $t_0$ 230, $t_1$ 232, and $t_2$ 234, sensors of the vehicle 236 may detect the object 238 and determine attribute data for a number of attributes (e.g., location, size, classification type, velocity, trajectory, etc.) for the object 238. By way of example only, at time $t_0$ 230 the object 238 is identified as a bicycle, at time $t_1$ 232 it is identified as a pedestrian, and at time $t_2$ 232 it is identified against as a bicycle. Accordingly, in this example, the classification type attribute data values for object 238 are inconsistent, and at least one of the attribute data values is incorrect.

When the attributes component 222 receives attribute data that is inconsistent and/or erroneous, the attributes component 222 may determine updated object attribute data values to replace the inconsistent or erroneous attribute data. As described in more detail below, the attributes component 222 may use additional attribute data, confidence values, and/or distance measurements associated with the data, to determine updated object attribute data values to replace the inconsistent or erroneous attribute data.

Additionally or alternatively, the attributes component 222 may determine estimated attribute data values based on the inconsistent and/or erroneous attribute data, using an estimation algorithm such as an averaging algorithm or a mode algorithm (e.g., selecting the most frequently appearing attribute value). For instance, the attributes component 222 may determine that the estimated size of an object 218 may be the size that is most frequently identified in the log data and use the size of the object 218 as indicated in states 204 and 206. In some instances, the attributes component 222 may determine the estimated position of the object 216 at time 212 by using the velocity attribute and the amount of time elapsed (e.g., if the object 216 is traveling with a velocity of 4.2 m/s over the course of two seconds, that the object would be 8.4 meters farther ahead).

In some examples, a scenario generator may generate simulation instructions based at least in part on the log data and the updated attribute data values, that, when executed by a simulator, can generate simulation data that represents states 202-206 and/or 224-228 in a simulated environment, in which the states have been to correct the erroneous and inconsistent attribute data. For purposes of illustration only, the synthetic simulation data may include a modified state 202 in which the size of vehicle 218 is corrected based on the updated attribute data value determined by the attributes component 222. Similarly, the synthetic simulation data may include a modified state 226 in which the object 238 is rendered as a bicycle for consistency with states 224 and 228, based on the updated attribute data value determined by the attributes component 222.

Figure 3B:
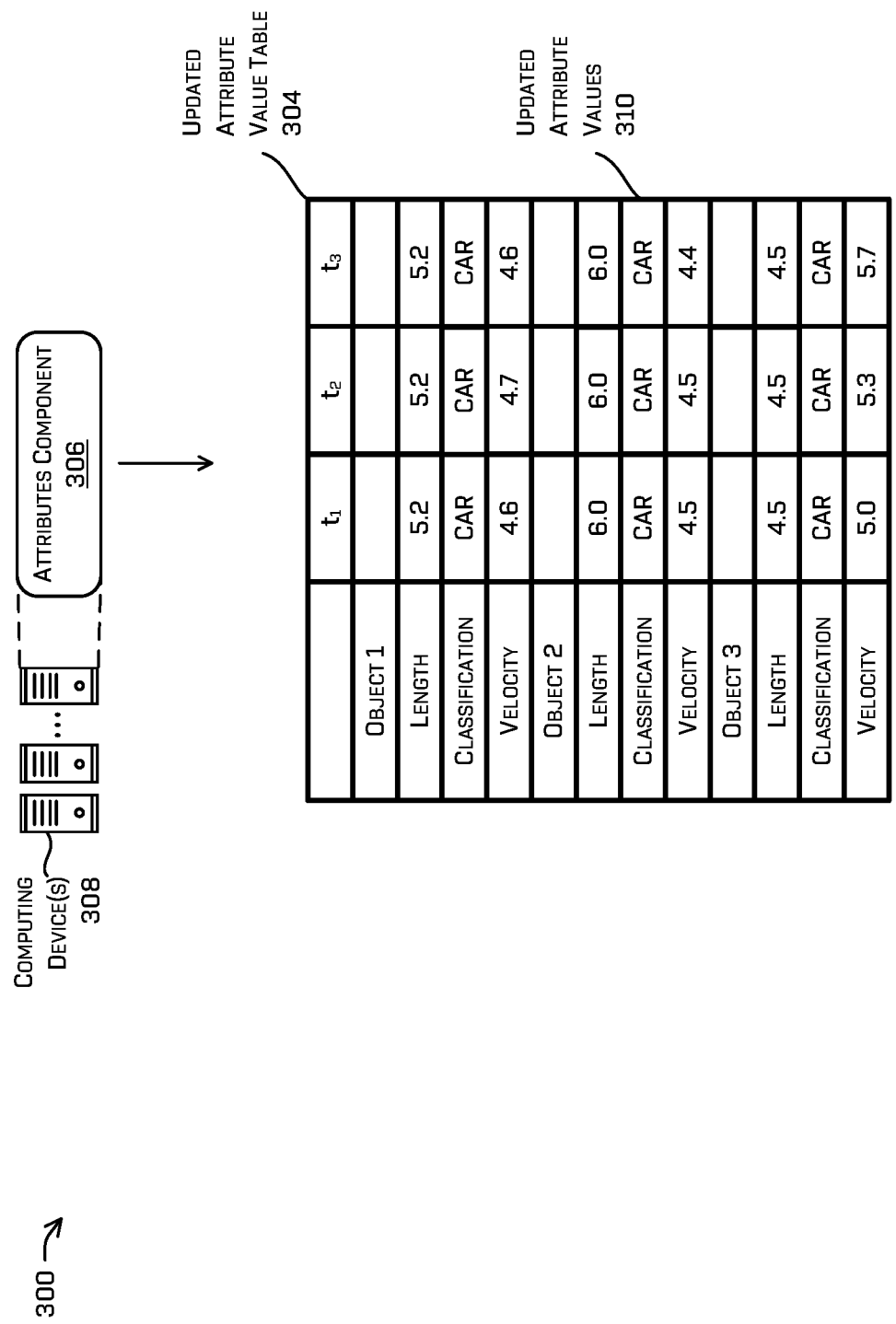

FIGS. 3A and 3B depict an example process 300 of generating, based on an object attribute data table 302, an updated attribute data value table 304 using an attributes component 306 of a computing device(s) 308. In some instances, the object attribute data table 302 can be similar to the log data attributes table 126 and the computing device(s) 308 can be similar to the computing device(s) 122 and 220 described above with respect to FIGS. 1 and 2, respectively.

As described above, a vehicle computing device can generate log data that may include sensor data, perception data, planning data, vehicle status data, velocity data, intent data, and/or other data generated by the vehicle computing device. A scenario generator, based on the log data, can determine the object attribute data table 302 that identifies attribute data associated with one or more objects of an environment at various times within the log data. As depicted in FIG. 3A, and for purposes of illustration only, the object attribute data table 302 may indicate that an Object 1 has a length of 5.1 meters at a time $t_0$, a length of 5.2 meters at a time $t_1$, and a length of 0.3 meters at a time $t_2$. The example object attribute data table 302 further indicates that the Object 1 has a classification type of a car at a time $t_0$, a classification type of a car at a time $t_1$, and a classification type of a cyclist at a time $t_2$, and a velocity of 4.5 m/s at a time $t_0$, a velocity of 4.8 m/s at a time $t_1$, and a velocity of 4.5 m/s at a time $t_2$. In some instances, the object attribute data table 302 may include various other attribute data, including but not limited position data, orientation data, and the like of the object. In some instances, some or all of the attribute data for objects in object attribute data table 302 may be used to determine that an object at to is the same object as the object at $t_1$ and at $t_2$. etc.

As shown in FIG. 3A, the object attribute data table 302 also may include a confidence value and distance measurement associated with each attribute data value determined for each object. In some examples, the attribute data, confidence values, and/or distance measurements may be determined by a perception component of the vehicle 104. The distance measurements in the object attribute data table 302 may indicate the distance between the associated objected and the vehicle 104 (or other sensor(s)), at the time when the sensor data used to determine the attribute data was captured. In some examples, distance measurements may be determined based on data from vehicle sensors such as time-of-flight sensors, location sensors (e.g., GPS, compass, etc.), lidar sensors, radar sensors, sonar sensors, infrared sensors, and/or cameras (e.g., RGB, IR, intensity, depth, etc.). The confidence values in the object attribute data table 302 may indicate confidence levels in the associated attribute data. In some examples, the perception component may determine the confidence values based on data such as the type and quality of the sensors that captured the sensor data, conflicting data from different sensors, and external factors such as the lighting and weather conditions at the time the sensor data was captured. Additionally, in some examples, the log data may indicate that an object is traveling away from the vehicle that captured/generated the log data, and the perception component may determine the confidence value associated with the classification type attribute of the object that decreases as the object travels away from the vehicle.

The attributes component 306 of the computing device(s) 308 may generate an updated attribute data value table 304 including determining updated attribute data values 310 for any or all of the attribute data in the object attribute data table 302. For instance, the attributes component 306 may determine which of the attribute data within the object attribute data table 302 is erroneous and/or inconsistent, and then may replace any erroneous and/or inconsistent attribute data with updated attribute data values 310 generated based on the attribute data, confidence values, and/or distance measurements associated with the attribute data in the object attribute data table 302. By way of example, attributes component 306 may determine updated attribute data values for any non-changing data attributes (e.g., which may typically include classification type or size) that have inconsistent attribute data values at different times. For instance, in the object attribute data table 302, the length of Object 2 at time $t_1$ is inconsistent with length of Object 2 at time $t_0$ and time $t_2$, indicating that the attributes component 306 may determine an updated attribute data value for the length of Object 2 for at least time $t_1$. Additionally, by way of example, for any changeable data attributes for an object (e.g., position, velocity, trajectory, etc.), the attributes component 306 may determine updated attribute data values when the value changes in a sequence of attribute data is unlikely and/or where the attribute data is inconsistent with other attribute data. For instance, in the object attribute data table 302, the velocity of Object 3 at time $t_2$ is unlikely based on the velocity of Object 3 at time $t_0$ and time $t_1$, indicating that the attributes component 306 may determine an updated attribute data value for the velocity of Object 3 for at least time $t_2$.

Figure 4:
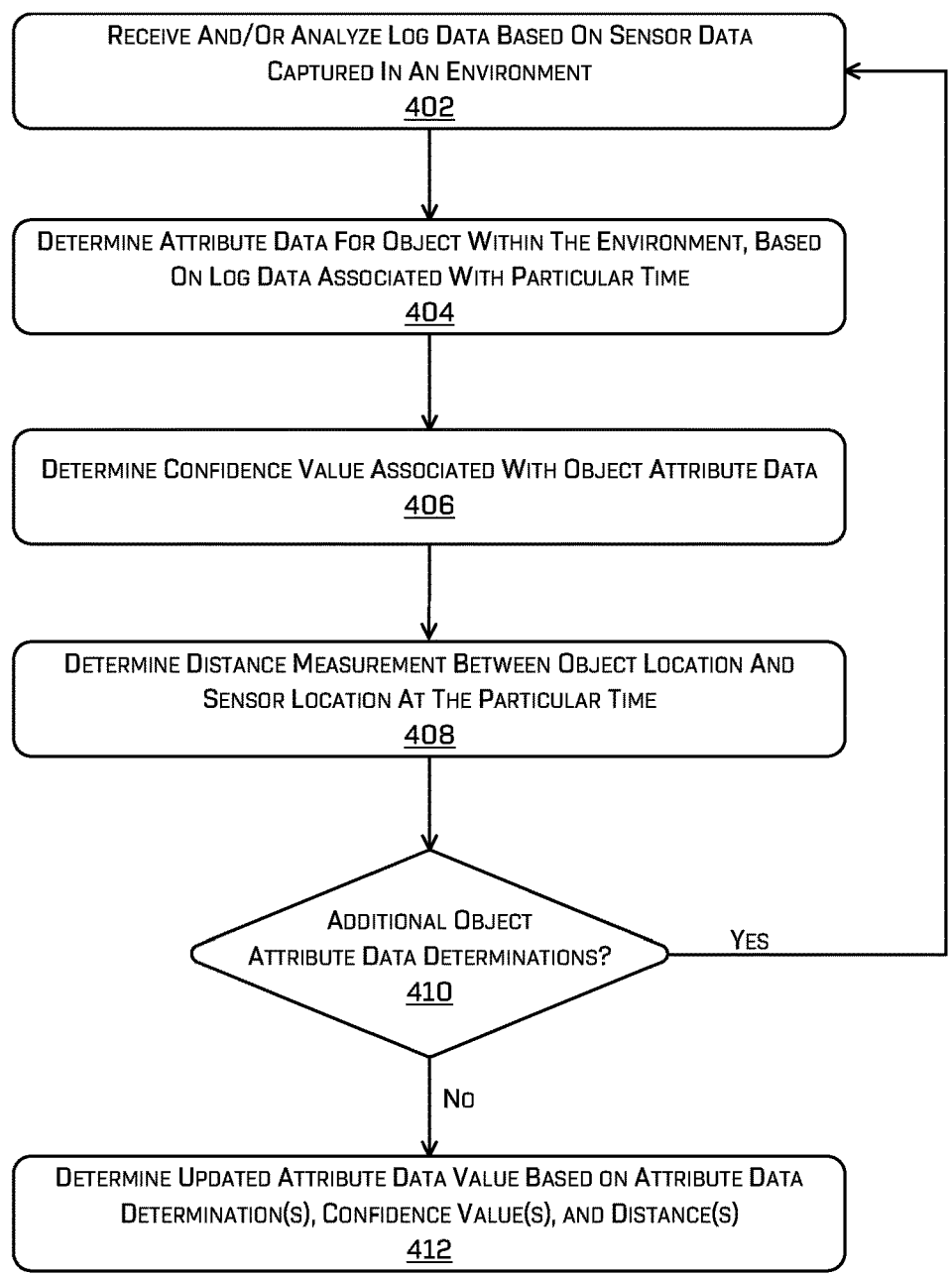
FIG. 4 depicts an example process for determining updated attribute data values using log data based on sensor data captured in an environment.

FIG. 4 depicts an example process 400 for determining updated attribute data values based on attribute data, confidence values, and/or distance measurements associated with the attribute data. In some instances, some or all of example process 400 may be performed by an attributes components 306 within a computing device(s) 308, as described herein. The example process 400 may be described below with reference to a vehicle 104 moving through an environment 102 and determining attribute data for objects 106 at multiple different points in time. Additionally, some portions of example process 400 may be omitted, replaced, and/or reordered while still providing the functionality of determining updated attribute data values.

At operation 402, the attributes component 306 may receive and/or analyze log data based on sensor data captured in an environment. In some examples, the log data may be data collected by a vehicle 104 as the vehicle drives within an environment 102 and captures various sensor data for objects 106 within the environment 102.

At operation 404, the attributes component 306 may determine attribute data for an object 106 within the environment 102, based on the log data received at operation 402. The attribute data may include values for specific attributes of an object 106 (e.g., position, size, classification type, velocity, trajectory, etc.) determined based on sensor data captured at a particular time. By way of example only, the attribute data determined in operation 404 may include any of the attribute data values shown in the "Data" columns of the object attribute data table 302 in FIG. 3A.

At operation 406, the attributes component 306 may determine a confidence value associated with the attribute data determined in operation 404. As noted above, the confidence value may indicate a level of confidence in the accuracy and/or precision of the associated attribute data. The confidence value may be determined by a perception component of the vehicle, based on data such as the type and quality of the sensors, additional data from different sensors, external factors such as the lighting and weather conditions, etc. By way of example only, the confidence values determined in operation 406 may be represented as a percentage between 0% and 100% and may include any of the confidence values shown in the "Conf" columns of the object attribute data table 302 in FIG. 3A.

At operation 408, the attributes component 306 may determine a distance measurement associated with the attribute data determined in operation 404. The distance measurement may be determined based on data from vehicle sensors such as time-of-flight sensors, location sensors, lidar sensors, radar sensors, sonar sensors, infrared sensors, cameras, etc. By way of example only, the measurement data determined in operation 408 may be represented as a distance (e.g., in feet or meters) and may include any of the distance measurements shown in the "Dist" columns of the object attribute data table 302 in FIG. 3A.

At operation 410, the attributes component 306 may determine whether the log data received at operation 402 includes any additional object attribute data that is associated with the attribute data determined in operation 404. As discussed above, as the vehicle 104 moves through the environment 102 the vehicle's sensors may repeatedly capture data for a number of objects 106 within the detection range of the sensors. For the purposes of illustration only, a vehicle 104 may capture sensor data of the environment at periodic intervals (e.g., 0.1 secs, 0.2 secs, . . . , 0.5 secs, . . . , 1 sec, etc.). Accordingly, as the vehicle 104 moves within the environment 102, the vehicle's sensors may capture a sensor data associated with a particular object 106 at different times, from which a perception component of the vehicle 104 may determine a sequence of attribute data values for the object 106. The log data may include multiple attribute data associated with the object 106, from a first time of the initial detection of the object 106 by the vehicle's sensors, to a final time of the last detection of the object 106 by the vehicle's sensors. At operation 410, if the log data includes additional attribute data for the same object 106 (410: Yes), then process 400 may return to operation 404 to determine the additional attribute data for the object 106.

Alternatively, if the log data does not include additional attribute data for the object 106 (410: No), then process 400 may proceed to operation 412, at which the attributes component 306 may determine updated attribute data values based on the attribute data, confidence values, and distance measures received in operations 804-808.

At operation 412, the attributes component 306 may use one or a combination of techniques to determine an updated attribute data value associated with an object 106 at a particular time. In some examples, the attributes component 306 may use the confidence values and distance measurements received at operations 406 and 408 to weight or modify the attribute data values received at operation 404. In other examples, operation 412 may include the attributes component 306 updated the confidence values received at 406 for the attribute data, based on the distance measurements received at 408, and then using the updated confidence values to determine the updated attribute data values. In still other examples, operation 406 may be optional and the attributes component 306 need not receive any confidence values, and instead may determine the confidence values based on the associated distance measurements received in operation 408 (and/or other log data), and then use the confidence values to determine the updated attribute data.

In some examples, determining the updated attribute data values at operation 412 may include multiplying the confidence value received at operation 406 by a distance-biased equation, using the distance measurement data received at operation 408. For instance, the attributes component 306 may execute Equation 1 below to determine an updated confidence value at operation 412:

$$\text{Updated } Conf. = Conf. * \frac{1}{1 + \left(\frac{\text{Distance}}{\text{Bias Halving Distance}}\right)^{\text{Curve Steepness}}} \quad \text{Equation 1}$$

As shown in this example equation, the confidence value received at operation 406, which is associated with the attribute data for an object 106 for a particular time, may be multiplied by a distance-biased equation to determine an updated confidence value, which may be used at operation 412 to determine the updated attribute data. In this example, the distance-biased equation uses the distance received at operation 408, a bias halving distance that may correspond to a distance at which the bias reaches 0.5, and a curve steepness factor that may be a tuning variable. In some instances, the curve steepness factor may be set to 2.5

In some instances, aspects of some or all of Equation 1 or other equations used for distance-biasing confidence values, may include any models, algorithms, and/or machine learning algorithms. For example, certain variables of Equation 1 including the bias halving distance and the curve steepness factor may be determined using machine learning algorithms and/or trained machine learning models, so that an optimized distance-biasing curve or curve steepness factor may be determined based on training environments 102.

As illustrated by FIG. 4, in some instances the attributes component 306 may determine an update attribute data based on a single attribute data and the associated confidence data and/or distance measurement. However, in other instances, the log data may include a sequence of multiple associated attribute data, such as when a vehicle 104 drives through an environment 102 and captures sensor data of an object 106 multiple times. In such instances, the attribute data values for the object 106 at certain times may be inconsistent or contradict with other attribute data values for the object 106 at other times. By way of example, in FIG. 3A the three different attribute data values for the classification type attribute of Object 1 are inconsistent, with attribute data indicating a classification type of car at time $t_0$ and time $t_1$, while indicating a classification type of bicyclist at time $t_2$.

When different attribute data values for an object 106 may be inconsistent or in conflict, the attributes component 306 may resolve the conflict in operation 412 by selecting the attribute data value having the highest overall confidence value(s). For example, the attributes component 306 may perform process 400 for each attribute data associated with the object 106 at each different time. Using Equation 1 or a similar technique, the result of the processes 400 may be updated confidence values for each attribute data value. Then, the attributes component 306 may average the confidence values associated with each different attribute data value, and compare the average confidence values. The updated attribute data value may be determined as the attribute data value having the highest average confidence. By way of example, in FIG. 3A, the updated confidence values for the two different attribute data values indicating that Object 1 has a classification type of car may be averaged, and the average may be compared to the updated confidence value for the one attribute data value indicating that Object 1 has a classification type of bicycle. The attributes component 306 may determine that the updated attribute data value is either car or bicycle, depending on the highest average of the updated confidence levels for the different attribute data values (e.g., car and bicycle).

Examples that include determining the highest average updated confidence levels among different attribute data values may provide technical advantages of improved data accuracy and consistency. For instance, as a vehicle 104 passes through an environment, the vehicle may capture large amounts of sensor data for an object 106. In some scenarios, the vehicle 104 may first capture attribute data for the object 106 at an initial detection point, may continue capturing closer-range sensor data while approaching the object 106, and then may capture additional sensor data for the object 106 while moving away from the object until a final detection (or termination) point. In such scenarios, the majority of the attribute data determined for the object 106 may be based on sensor data captured at farther distances from the object 106, while relatively few of the attribute data may be based on closer-range sensor data. Accordingly, an unbiased average of the confidence values may favor longer-range and less accurate sensor data, due to the larger amount of sensor data captured at farther distances from the object. On the other hand, determining attribute data based on one or a select few of the attribute data values determined based on the close-range sensor data may lead to inaccuracies whenever the close-range sensor data is inaccurate. Therefore, using the techniques described herein including distance-biasing the confidence levels associated with the attribute data, and then determining the highest average of the updated confidence levels, the attributes component 306 may improve the accuracy and consistency of the attribute data determinations for object detected in an environment.

In some examples, the equations and/or other techniques used by the attributes component 306 to determine updated attribute data values in operation 412, may be based on the attribute types and/or the classification type of the object 106 associated with the attribute data. For instance, the attributes component 306 may use one variation of Equation 1 to determine an updated confidence value for a classification type attribute data value, and may use a different variation of Equation 1 (e.g., different tuning variables) or a different equation altogether to determine an updated confidence value for a size attribute data value, or a location/position attribute data value, or a velocity attribute data value, etc. By way of example only, the attributes component 306 may use a first equation or technique for distance-biasing attributes such as object classification type and velocity, which may be determined from longer distances more accurately and with higher confidence. In contrast, the attributes component 306 may use a second equation or technique for distance-biasing attributes such as object size and orientation, which may be determined with less reliability (e.g., less confidence) from longer distances.

Additionally or alternatively, the attributes component 306 may use different distance-biasing curves and equations, and/or other techniques for updating attribute data, based on the classification type of the object 106. By way of example only, objects of certain classification types (e.g., bicycles) may have a higher frequency of misclassification at close range, while other classification types (e.g., cars) may have higher frequency of misclassification at long range. In order to take into account the differences of misclassification of object types at different distance ranges, the attributes component 306 may use a first equation or technique for distance-biasing attributes of certain object classification types, while using a second equation or technique for distance-biasing attributes of other object classification types.

As noted above, the techniques described herein for determining updated attribute data for objects within an environment, based on a combination of confidence data and/or distance measurements associated with the attribute data values, may provide a number of technical advantages relating to improvements in the accuracy and consistency of the object attribute data. As described in the examples below, the updated attribute data values may be used as synthetic data to generate simulations and simulated environments. Accordingly, additional advantages of the present techniques may include improved simulations and simulated environments based on the attribute data determined based on sensor data captured in environments. However, although several examples described herein may relate to log data based on sensor data captured by a vehicle 104 driving within an environment 102, it is contemplated that the techniques described herein also may apply to log data captured by other types of moving or stationary cameras or other sensors (e.g., fixed-location traffic camera, building security systems, public closed-caption video systems, etc.).

In some examples, the techniques described herein relating to distance-biasing of confidence values also may be used in conjunction with clustering techniques to further improve synthetic data generation for simulation scenarios. For instance, the attributes component 222 (and/or other components within computing device(s) 122) may implement a clustering technique used to determine updated object attribute data for a particular time during the simulation. When a clustering technique is used, the attributes component 222 may determine the updated object attribute data based not only on the object attribute data from the sensor data/log data at the associated time, but on a "cluster" of object attribute data from the sensor data/log data at multiple points in time before and/or after the associated time. For example, for simulating position and velocity of a moving object (e.g., a vehicle, pedestrian, bicycle, etc.) in a simulated environment at a time $t_n$, the attributes component 222 may determine the accurate position and velocity of the object not only based on the sensor data/log data associated time $t_n$, but based on a cluster of surrounding sensor data/log data. For the purposes of illustration only, the determined cluster for time $t_n$ may include observation times ($t_{n-j}$, $t_{n-2}$, $t_{n-1}$, $t_n$, $t_{n+1}$, $t_{n+2}$, and $t_{n+k}$), at which sensor data was collected for the object, and it is contemplated that different sized clusters may be used in other examples (e.g., variables j and k may be any values). Based on the object attribute data captured at the cluster of different observation times, the attributes component 222 may determine more accurate object attribute data for the simulated object at the time $t_n$.

In some examples, data associated with a cluster can be averaged, aggregated, smoothed, or otherwise statistically determined based on individual values associated with the cluster. For example, a velocity value associated with an object at time $t_1$ can be an average of the velocity of that object at times $t_0$ and times $t_2$. Clustering techniques may be used in various different simulation scenarios to determine updated object attribute data. For example, when a simulated object is instantiated within a simulated environment, based on log data of an object 516 detected by an autonomous vehicle 514 traversing an environment, the simulator may update the attribute data for the simulated object less often than the log data was captured by the sensor(s) of the vehicle 514 for the object 516. For instance, if the log data has been captured for object 516 at times $t_1$, $t_2$, $t_3$, $t_4$, $t_5$, $t_6$, $t_7$, $t_8$, $t_9$, and $t_{10}$, the simulator might only update the attribute data for the simulated object at times corresponding to $t_3$, $t_6$, and $t_9$, etc. In this example, the attributes component 222 may determine attribute data for the simulated object at time $t_3$ based on the log data from surrounding times $t_1$, $t_2$, $t_3$, $t_4$, and $t_5$, may determine attribute data for the simulated object at time $t_6$ based on the log data from surrounding times $t_4$, $t_5$, $t_6$, $t_7$, and $t_8$, and so on. As this example shows, the clusters of object attribute data for the simulated object may be overlapping, although non-overlapping clusters also may be used in some instances.

The use of clustering techniques in conjunction with distance-biasing of weights and/or confidence values for determining updated object attribute data may provide additional technical advantages for generating data for simulation scenarios. For instance, performing a distance-biasing of weights and/or confidence values to determined updated object attribute data, along with using clustering, may result in more accurate updated object attribute data as well as improved data smoothing to provide more realistic simulation scenarios. The attributes component 222 may implement both distance-biasing and clustering to determine updated object attribute data, which may improve simulation quality in particular by smoothing of changeable (or dynamic) attribute types such as object position, velocity, yaw, and trajectory. Thus, in some examples, the attributes component 222 may apply distance-biasing and clustering on a subset of attribute types (e.g., dynamic attribute types), and not on a different subset of attribute types, for instance, non-changing (or static) attribute types such as classification type, object size, etc.

To perform a clustering technique in conjunction with distance-biasing (or distance weighting) of confidence values, the attributes component 222 may determine, for a time in the simulation at which a simulated object is instantiated, a number of associated observation times in the corresponding log data/sensor data before, at, and/or after the simulation time. The attributes component 222 may receive or determine an associated confidence value and/or distance associated with each of the object attribute data from the associated observation times. The attributes component 222 then may determine the updated object attribute data based on the cluster of object attribute data from the associated observation times, and the associated distance-biased weights or confidence values for each of the cluster of object attribute data.

Additionally, clustering techniques and distance-biased weights and/or confidence values may be used and may provide advantages for determine object attribute data for first initial detection times and last final detection times of objects. For example, clustering may be used to determine object attribute data for simulation scenarios at the first time of the initial detection of the object 106 by the vehicle's sensors, when previous observation points are not available in the sensor data/log data, by clustering based on the subsequent observation points and extrapolating back to determine an updated object attribute data for the first time of initial object detection. Similarly, for the final detection time of the object 106 by the vehicle's sensors, the object attribute data used for simulation scenarios at the final time, when subsequent observation points are not available in the sensor data/log data, may be determined by clustering based on the previous observation points and extrapolating forward to determine the updated object attribute data for the final time of object detection.

Figure 5:
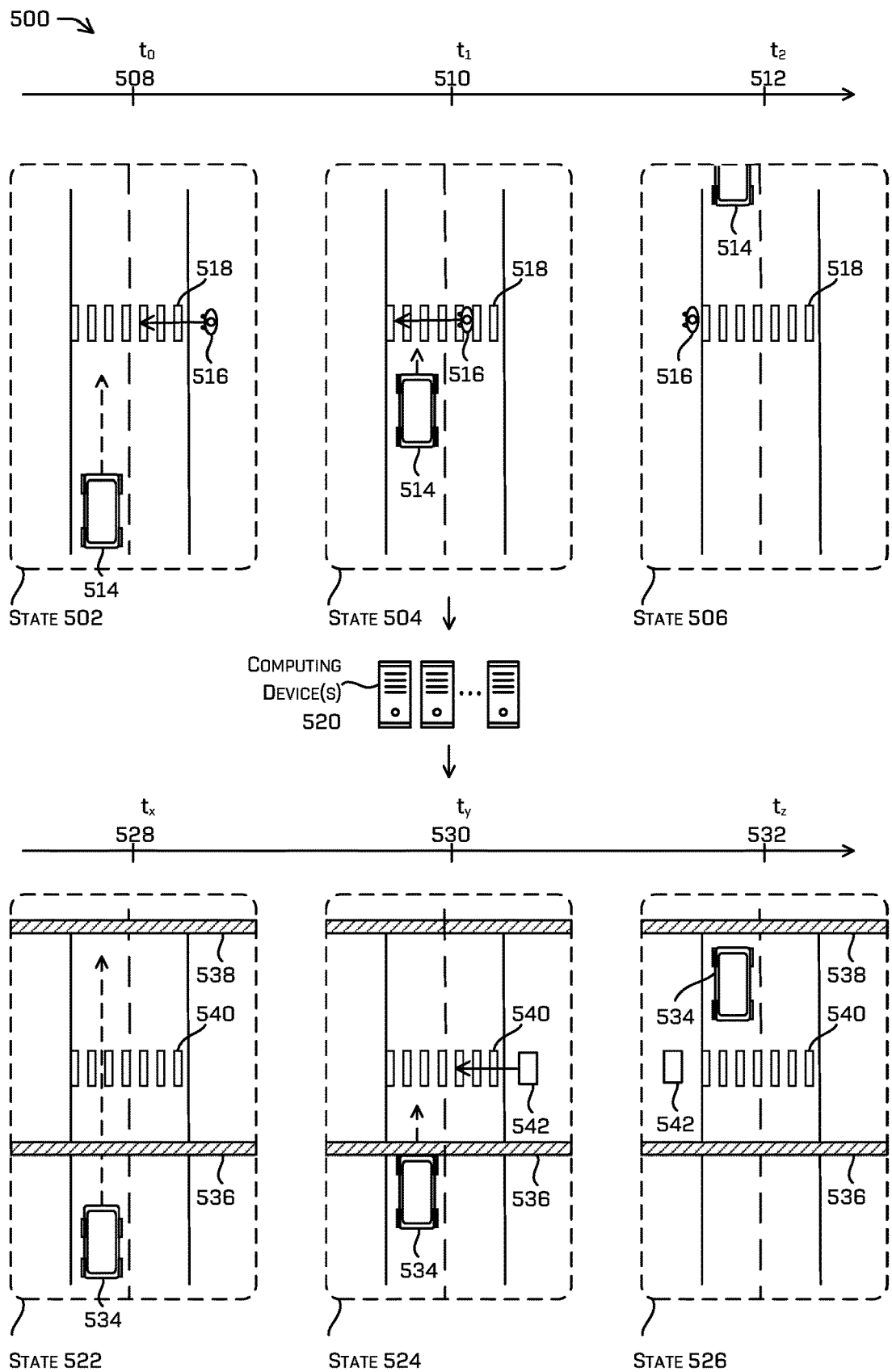
FIG. 5 depicts log data that represents a vehicle and an object in an environment at multiple instances of time and simulation instructions based on the log data that, when executed by a simulator, represent a simulated vehicle and a simulated object in a simulated environment with a trigger region at multiple instances of time.

FIG. 5 illustrates an example 500 that depicts a scenario generator instantiating a simulated object based on a vehicle crossing an instantiation trigger region and destroying the simulated object based on the vehicle crossing a destruction trigger region in a simulated environment.

The log data can represent states 502, 504, and 506 of an environment that are associated with times $t_0$ 508, $t_1$ 510, and $t_2$ 512. At a time $t_0$ 508, the state 502 can represent a vehicle 514 as traversing the environment with an object 516 (e.g., a pedestrian) to the right of vehicle 514 in front of a crosswalk 518. At a time $t_1$ 510 that is after time $t_0$, the state 504 can represent the vehicle 514 as traversing the environment and stopping at the crosswalk 518 to allow the object 516 to cross the crosswalk. At a time $t_2$ 512 that is after times $t_0$ and $t_1$, the state 506 can represent the vehicle 514 as traversing the environment and completing a pass of the crosswalk 518 and the object 516 completing a crossing of the crosswalk 518.

The log data can be transmitted to computing device(s) 520 that is executing a scenario generator. In some instances, the computing device(s) 520 can be similar to the computing device(s) 122, 220, and 308 described above with respect to FIGS. 1, 2, and 3, respectively.

A trigger component that is executing on the computing device(s) 520 can determine an instantiation trigger region (also referred to as an instantiation region) and a destruction trigger region (also referred to as a destruction region) that is associated with an instantiation and a destruction, respectively, of the object 516. For example, the scenario generator can generate simulation instructions, based at least in part on the log data, that, when executed by a simulator, can generate simulation data that represents states 522, 524, and 526 of a simulated environment that are associated with times $t_x$ 528, $t_y$ 530, and $t_z$ 532. At a time $t_x$ 528, the state 522 can represent the simulated vehicle 534 as traversing the simulated environment with an instantiation trigger region 536, a destruction trigger region 538, and a simulated crosswalk 540. The instantiation trigger region 536 and the destruction trigger region 538 can be associated with a simulated object 542. A simulation component that is executing on the computing device(s) 520 can monitor a location of the simulated vehicle 534 to determine when the simulated vehicle 534 will activate/trigger a trigger region. At a time $t_y$ 530 that is after time $t_x$, the state 524 can represent the simulated vehicle 534 as traversing the simulated environment and beginning to cross or activate the instantiation trigger region 536. The scenario generator can, based on the simulated vehicle 534 beginning to cross the trigger region, instantiate the simulated object 542 (e.g., a simulated pedestrian) in front of the simulated crosswalk to the right of simulated vehicle 534. In some instances, the simulated vehicle 534 can change its trajectory based on detecting the simulated object 542 and come to a stop before entering the simulated crosswalk 540.

At a time $t_z$ 532 that is after times $t_x$ and $t_y$, the state 526 can represent the simulated vehicle 534 as traversing the simulated environment after passing the simulated crosswalk 540. Additionally, the state 526 can represent the simulated object 542 that has completed crossing the sidewalk. When the simulated vehicle 534 crosses and/or activates the destruction trigger region 538, the simulation component can destroy/despawn the simulated object 542.

Therefore, the instantiation trigger region 536 can represent a region in a simulated environment that, when interacted with by the simulated vehicle 534 (e.g., crossing the trigger region or being located within a threshold distance of the trigger region), can cause the simulated object 542 to become instantiated in the simulated environment. In some instances, the location of the trigger region can be based on the perception of the object represented in the log data. By way of example and without limitation, the vehicle 514 can traverse an environment and the perception component of the vehicle 514 can detect that the object 516 is situated to the right of the vehicle 514 at a distance of 50 meters. In some instances, the object 516 can become perceptible to the vehicle 514 due to an occlusion no longer occluding the object 516. The trigger component can, based on the perception range of the perception component of the vehicle 514, determine the location of the instantiation trigger region 536 based on the distance of 50 meters. In some instances, the trigger component can determine a location of the trigger region based on an average detection range of various sensor modalities.

Similarly, and by way of example and without limitation, the vehicle 514 can traverse the environment and the perception component of the vehicle 514 can determine that the object 516 is no longer within a perceptible (e.g., visible) range at a distance of 70 meters. In some instances, the object 516 can become no longer perceptible due to the object 516 becoming occluded. The trigger component can, based on the perception range of the vehicle 514, determine the location of the destruction trigger region 538. In some instances, the trigger component can determine the location of the destruction trigger region 538 based on a trajectory associated with the object 516. For example, the trigger component can determine that a trajectory of the object 516 indicates that the object is moving away from the vehicle 514 and will no longer further interact with the vehicle 514 for the purposes of the simulation. Then, based on a perception range associated with the vehicle 514, an amount of time, or any combination thereof, the trigger component can determine a destruction trigger region associated with the simulated object 542.

In some instances, the trigger component can determine a termination trigger region (also referred to as a destruction trigger region or a destruction region) that terminates an object based on the vehicle 514 interacting (e.g., crossing the termination trigger region). In some instances, the trigger component can determine other trigger regions associated with other object attributes and/or actions. For purposes of illustration only, the trigger component can generate a trigger region that is associated with a lane change action of a simulated object.

In some instances, the trigger component can determine a trigger region (e.g., an instantiation trigger region and/or a termination trigger region) based on the perception range of the vehicle 514 and move the trigger region (or determine a different trigger region) based on a simulation interaction/timing change. By way of example and without limitation, the vehicle 514 can traverse the environment and deviate from the log data. The trigger component can determine trigger regions that can cause the vehicle 514 to instantiate an object or destroy an object at an earlier time or a later time to cause the vehicle 514 to interact with the object based on, for example, the deviation.

Figure 6A:
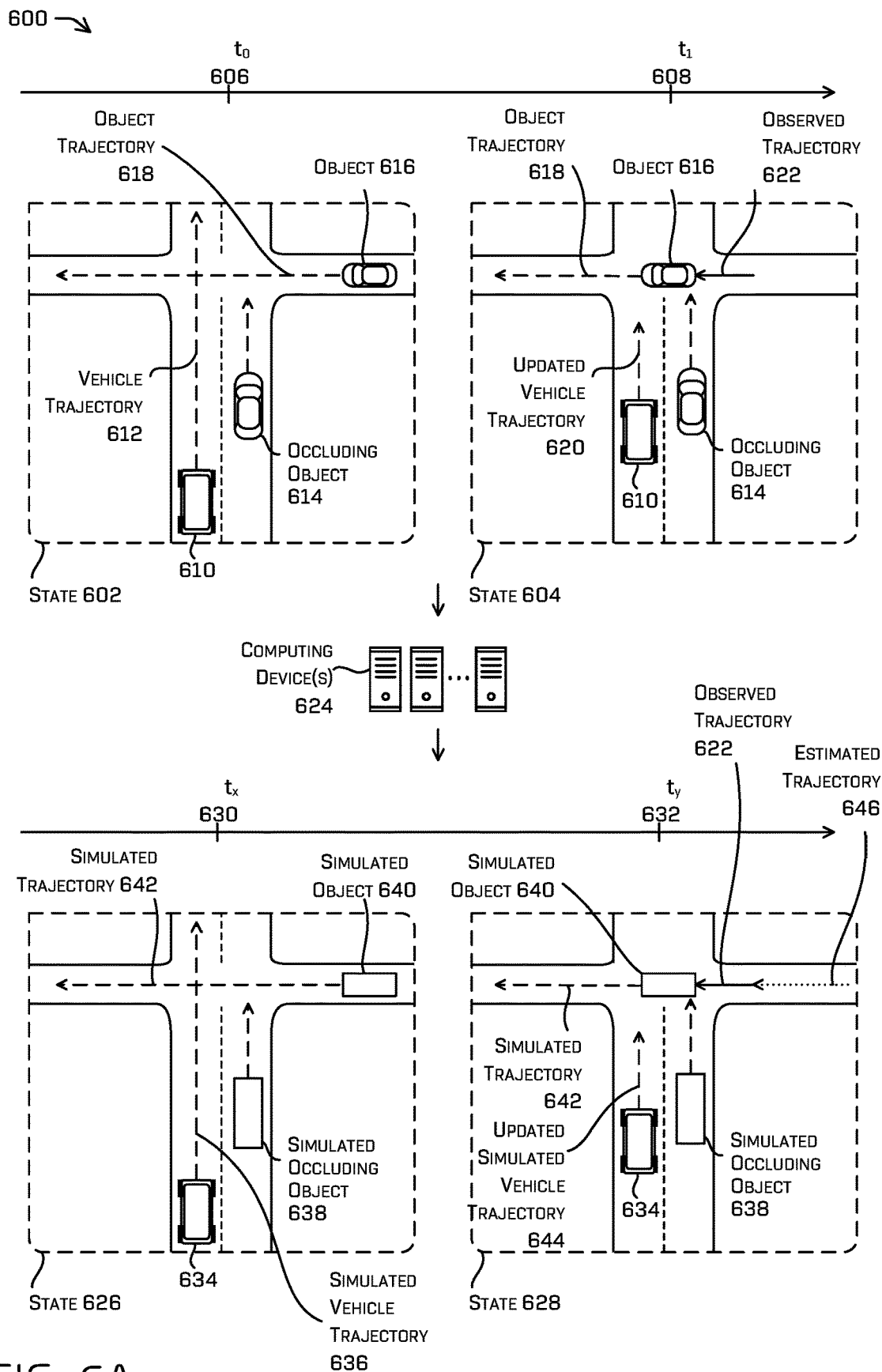
FIG. 6A depicts an example environment that includes a vehicle and an object that becomes visible and an observed trajectory associated with the object and an example simulated environment that includes a simulated vehicle and a simulated object that becomes visible with an observed trajectory and an inferred trajectory.
Figure 6B:
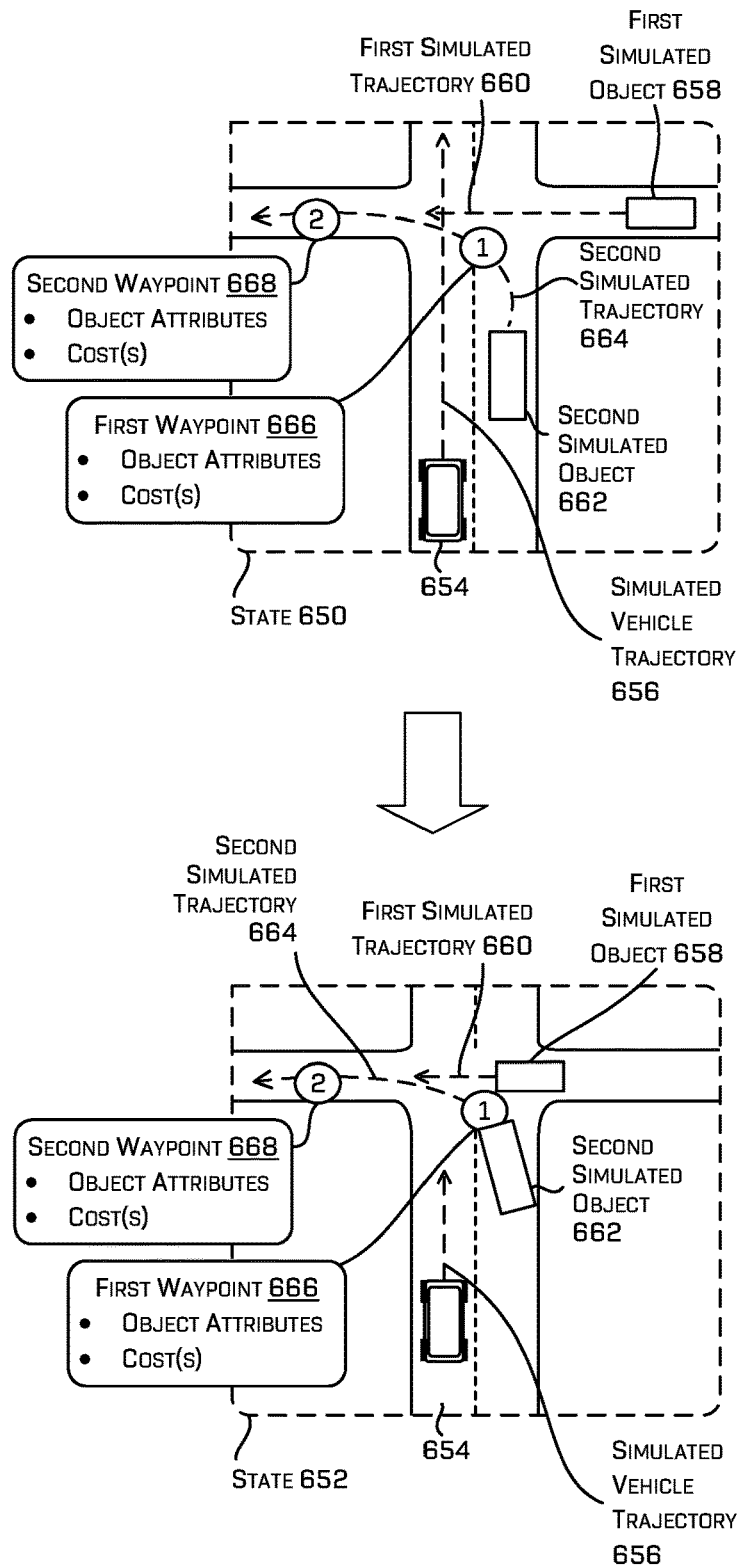
FIG. 6B depicts an example simulated environment that includes a simulated vehicle traversing an environment with a first simulated object traversing a first simulated trajectory and a second simulated object traversing a second simulated trajectory with waypoints associated with the second simulated trajectory.

FIGS. 6A and 6B illustrate examples 600 and 648 that depict simulated scenario that includes instantiating simulated objects with an inferred trajectory in a simulated environment. In FIG. 6A, the log data can represent states 602 and 604 of an environment that are associated with times $t_0$ 606 and $t_1$ 608. At a time $t_0$ 606, the state 602 can represent a vehicle 610 as traversing the environment along a vehicle trajectory 612. The state 602 can also represent an occluding object 614 (e.g., a large, slow-moving vehicle) that occludes a portion of the environment from the vehicle 610. The state 602 can also represent an object 616 that is traversing the environment along an object trajectory 618.

For purposes of illustration only, the placement of the occluding object 614 occludes the portion of the environment such that the vehicle 610 is unable to detect the object 616 the time $t_0$ 606. At a time $t_1$ 608 that is after time $t_0$ 606, the state 604 can represent the vehicle 610 as traversing the environment traversing along an updated vehicle trajectory 620. As the vehicle 610 approaches the intersection depicted in state 604, the vehicle's 610 perception component can detect the object 616 as crossing in front of the vehicle 610 and, in response, the vehicle 610 can update its trajectory to updated vehicle trajectory 620 which can allow the vehicle to safely slow down and/or come to a stop to prevent a collision which object 616. The log data can indicate that as the object 616 became visible (unoccluded), the vehicle's 610 perception component could detect a portion of the object's 616 trajectory depicted as the observed trajectory 622 (also referred to as a logged trajectory).

The log data can be transmitted to computing device(s) 624 that is executing a scenario generator. In some instances, the computing device(s) 624 can be similar to the computing device(s) 122, 220, 308, and 520 described above with respect to FIGS. 1, 2, 3, and 5 respectively.

As discussed above, an attributes component, similar to the attributes component 306 described above with respect to FIG. 3, that is executing on the computing device(s) 624 can determine attribute data associated with the object 616. In some instances, the attribute data can indicate a trajectory associated with the object 616. As depicted in FIG. 6A, and for purposes of illustration only, the scenario generator can generate simulation instructions, based at least in part on the log data, that, when executed by a simulator, can generate simulation data that represents states 626 and 628 of a simulated environment that are associated with times $t_x$ 630 and $t_y$ 632. At a time $t_x$ 630, the state 626 can represent the simulated vehicle 634 as traversing the simulated environment following a simulated vehicle trajectory 636. Similar to state 602, state 626 can include a simulated occluding object 638 as well as simulated object 640 following a simulated trajectory 642. At a time $t_y$ 632 that is after time $t_x$ 630, the state 628 can represent the simulated vehicle 634 as traversing the simulated environment and executing an updated simulated vehicle trajectory 644 based on detecting the simulated object 640 crossing in front of the simulated vehicle 634. Additionally, the attributes component can determine the estimated trajectory 646 of the simulated object 640 despite being occluded by the simulated occluding object 638 during that portion of the simulated object's 640 trajectory. In some instances, determining the estimated trajectory 646 can allow for a more robust testing of the controller associated with the simulated vehicle 634 by removing the simulated occluding object 638 and determining a response by the controller of the simulated vehicle 634. In some instances, the estimated trajectory 646 can allow for the scenario to include a simulated trajectory of the simulated object 640 that represents a trajectory that is not represented in the log data.

In some examples, attributes component 306 can determine waypoint(s) and/or paths associated with the simulated object. By way of example and without limitation, such waypoints or paths can be based at least in part on the log data representing the object corresponding to the simulated object. In some examples, waypoints can be determined based on a curvature of a path segment or can be added manually in a user interface. Such waypoints or paths can be associated with various costs or weights that influence a behavior of the simulated object in the simulated environment. For example, a waypoint can be associated with a position cost or a time cost that enforces a distance or position of the simulated object in the simulated environment. Such waypoints or paths can be associated with events or actions, such as a lane change action, using trigger regions. For example, the log data can indicate that an object performed a lane change action that placed the object to the right of the vehicle. Additionally, the log data can indicate that the vehicle attempted to perform a lane change action to the right but did not complete the action due to the object. In order to preserve this interaction in the simulated scenario, the attributes component 306 can assign a waypoint attribute associated with the trajectory of the simulated object such that the simulated object performs the lane change action and remains on the right side of the simulated vehicle. Controllers associated with the simulated vehicle may then, in such examples, determine controls for the simulated vehicle which adapt to changes in the scenario while minimizing deviations from the paths as originally taken.

Additionally, the attributes component 306 can determine a simulation cost associated with various parameters associated with the simulated vehicle and/or the simulated objects. By way of example and without limitation, and as discussed above, the attributes component 306 can associate a waypoint and/or a path with the simulated object to influence the behavior of the simulated object in the simulated environment. In some cases, motion of the simulated object may be based at least in part on one or more costs, including but not limited to a reference cost (e.g., a cost based on a distance of the simulated object from a reference trajectory, such as the path of the object represented in the log data), an obstacle cost (e.g., a cost based on a distance between the simulated object and other object(s) in the simulated environment), an acceleration cost (e.g., a cost associated with speeding up or slowing down, such as maximum and/or minimum acceleration(s)), and/or a steering cost (e.g., a cost based on steering angle(s) of the simulated object, which may or may not be based on a velocity of the simulated object), although other costs are contemplated. The controller of the simulated object can determine an alternate trajectory (also referred to as a candidate trajectory) and have an associated simulation cost. In some instances, a first trajectory can be associated with a simulation cost that is higher than a second trajectory and the planner can determine to execute the trajectory associated with a lower simulation cost.

In some instances, the attributes component 306 can associate weights to various vehicle parameters, waypoints, trajectories, and the like. For purposes of illustration only, and as discussed above, the simulated object can have a simulation cost associated with a first trajectory associated with a waypoint that places the simulated object to the right of the simulated vehicle. Additionally, the simulated object can determine a second trajectory that does not place the simulated object to the right of the simulated vehicle. A weight can be assigned to the first trajectory and/or the second trajectory. For example, the purpose of the simulation can be to determine how the simulated vehicle responds when the simulated object is to the right of the simulated vehicle. A user can adjust the weight associated with the first trajectory and assign it a weight that is significantly higher than the weight assigned to other trajectories. In some instances, a trajectory associated with a higher cost can still be the trajectory traversed by a simulated object if the weight is sufficient to overcome the cost difference with other trajectories associated with a lower cost. In such examples, weighting may be indicative of how much a simulated vehicle's trajectory can differ from an associated previously recorded trajectory.

Therefore, the simulated vehicle 634, and the simulated object 640, can perform actions that differ from the actions associated with the vehicle 610 in the log data and the estimated trajectory 646 can allow for the simulated vehicle 634 to detect the simulated object 640 at a location associated with the estimated trajectory 646. By way of example and without limitation, the simulated vehicle 634 can traverse along the simulated vehicle trajectory 636 at a higher velocity which can allow the simulated vehicle 634 to detect the simulated object 640 as the simulated object traverses along the estimated trajectory 646 and before the observed trajectory 622.

In some instances, the estimated trajectory 646 can be determined based on a trigger region. As discussed above, waypoints and/or paths can be associated with events and/or actions. A trigger region can be associated with a waypoint such as to direct a trajectory of a simulated object upon an activation of a trigger region. As discussed above, in some instances, a trigger region can be an instantiation trigger region where when the simulated vehicle 634 crosses or activates the instantiation trigger region, a simulation component can instantiation a simulated object (e.g., simulated object 640). In some instances, the simulated vehicle 634 can activate the instantiation trigger region at a portion of the simulation that precedes the observed trajectory 622. Thus, the estimated trajectory 646 can indicate a location (e.g., a location along the estimated trajectory 646) to instantiate the simulated object 640. In some instances, the simulation component can instantiate the simulated object 640 based on the estimated trajectory 646 as well as a perception range associated with the simulated vehicle 634.

FIG. 6B depicts an example 648 that depicts a simulated scenario with simulated objects and waypoints associated with a simulated trajectory of a simulated object, at a state 650 and a state 652 that follows a period of time after state 650. FIG. 6B includes numbering such as ①, ②, ③, etc. This numbering is intended to orient a reader to one possible order of operations, but is not intended to be construed as a limitation, as discussed herein.

At state 650, the simulated vehicle 654 traverses a simulated environment while following a simulated vehicle trajectory 656. A first simulated object 658 is following a first simulated trajectory 660 and a second simulated object 662 is following a second simulated trajectory 664. The second simulated trajectory 664 can be associated with a first waypoint 666 at location ① and a second waypoint 668 at location ②. As discussed above, the attributes component 222 can determine waypoint(s) ① and ② associated with the second simulated object 662 along the second simulated trajectory 664.

When determining the simulated scenario, the attributes component 306 can determine a trajectory that respects or otherwise represents the attributes associated with the waypoints 666 and/or 668 (e.g., by minimizing a difference between a trajectory of the object in simulation and the observed trajectory of the object). For example, at state 652, the second simulated object 662 can traverse the simulated environment such that, when the second simulated object 662 reaches the first waypoint 666, the behavior of the second simulated object 662 can be substantially similar (at least in part and within a threshold) to the attributes associated with the first waypoint 666.

For example, the object attributes can include a speed, a steering angle, yaw rate, acceleration, classification, predicted trajectory, uncertainty, and/or other object parameters. Additionally, cost(s) that indicates a simulation cost (e.g., a reference, cost, an obstacle cost, an acceleration cost, and/or a steering cost) can be determined for the first waypoint 666. For example, cost(s) can be determined based at least in part on object attributes (e.g., a speed, a steering angle, yaw rate, acceleration, classification, predicted trajectory, uncertainty, and/or other object parameters) associated with the second simulated trajectory 664. In some instances, the first waypoint 666 can be associated with a threshold such that if determined cost(s) meet or exceed a threshold, the second simulated trajectory 664 can be rejected or modified to determine an updated trajectory with cost(s) that do not exceed the threshold. Similarly, when the second simulated object 662 reaches the second waypoint 668, the behavior of the second simulated object 662 has parameters substantially similar (at least in part and within some threshold) to the attributes associated with the object attributes of the second waypoint 668.

As depicted in FIG. 6B, the second simulated object 662 can be traversing along the second simulated trajectory 664 that can interfere with the first simulated trajectory 660 that is associated with the first simulated object 658. By way of example and without limitation, based on the cost associated with the second waypoint 668, a deviation of the second simulated object 662 from reaching the second waypoint 668 can be high enough such that the second simulated object 662 will continue along the second simulated trajectory 664 and attempt to cut in front of the first simulated object 658. In some instances, a deviation of the second simulated object 662 from reaching the second waypoint 668 can be low enough such that the second simulated object 662 will halt along the second simulated trajectory 664 to avoid a potential collision between the second simulated object 662 and the first simulated object 658.

Figure 7:
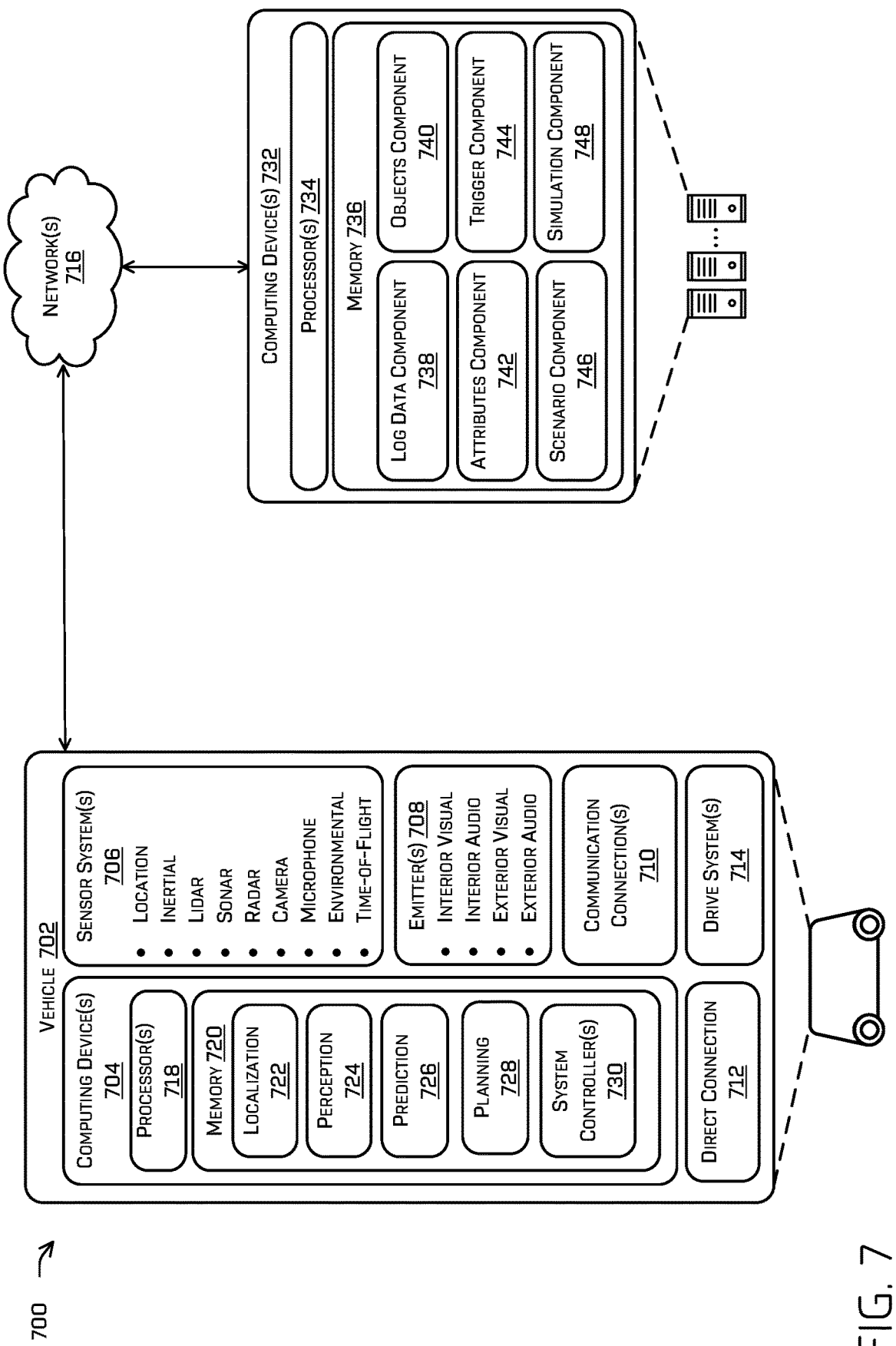
FIG. 7 depicts a block diagram of an example system for implementing the techniques described herein.

FIG. 7 depicts a block diagram of an example system 700 for implementing the techniques discussed herein. In at least one example, the example system 700 can include a vehicle 702, which can be similar to the vehicle(s) 104 described above with reference to FIG. 1. In the illustrated example system 700, the vehicle 702 is an autonomous vehicle; however, the vehicle 702 can be any other type of vehicle.

The vehicle 702 can be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle 702 can be configured to control all functions from start to completion of the trip, including all parking functions, it may not include a driver and/or controls for driving the vehicle 702, such as a steering wheel, an acceleration pedal, and/or a brake pedal. This is merely an example, and the systems and methods described herein may be incorporated into any ground-borne, airborne, or waterborne vehicle, including those ranging from vehicles that need to be manually controlled by a driver at all times, to those that are partially or fully autonomously controlled.

The vehicle 702 can be any configuration of vehicle, such as, for example, a van, a sport utility vehicle, a cross-over vehicle, a truck, a bus, an agricultural vehicle, and/or a construction vehicle. The vehicle 702 can be powered by one or more internal combustion engines, one or more electric motors, hydrogen power, any combination thereof, and/or any other suitable power sources. Although the vehicle 702 has four wheels, the systems and methods described herein can be incorporated into vehicles having fewer or a greater number of wheels, and/or tires. The vehicle 702 can have four-wheel steering and can operate generally with equal or similar performance characteristics in all directions, for example, such that a first end of the vehicle 702 is the front end of the vehicle 702 when traveling in a first direction, and such that the first end becomes the rear end of the vehicle 702 when traveling in the opposite direction. Similarly, a second end of the vehicle 702 is the front end of the vehicle when traveling in the second direction, and such that the second end becomes the rear end of the vehicle 702 when traveling in the opposite direction. These example characteristics may facilitate greater maneuverability, for example, in small spaces or crowded environments, such as parking lots and/or urban areas.

The vehicle 702 can include a computing device(s) 704, one or more sensor system(s) 706, one or more emitter(s) 708, one or more communication connection(s) 710 (also referred to as communication devices and/or modems), at least one direct connection 712 (e.g., for physically coupling with the vehicle 702 to exchange data and/or to provide power), and one or more drive system(s) 714. The one or more sensor system(s) 706 can be configured to capture sensor data associated with an environment.

The sensor system(s) 706 can include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor system(s) 706 can include multiple instances of each of these or other types of sensors. For instance, the time-of-flight sensors can include individual time-of-flight sensors located at the corners, front, back, sides, and/or top of the vehicle 702. As another example, the camera sensors can include multiple cameras disposed at various locations about the exterior and/or interior of the vehicle 702. The sensor system(s) 706 can provide input to the computing device(s) 704.

The vehicle 702 can also include one or more emitter(s) 708 for emitting light and/or sound. The one or more emitter(s) 708 in this example include interior audio and visual emitters to communicate with passengers of the vehicle 702. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 708 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 702 can also include one or more communication connection(s) 710 that enable communication between the vehicle 702 and one or more other local or remote computing device(s) (e.g., a remote teleoperations computing device) or remote services. For instance, the communication connection(s) 710 can facilitate communication with other local computing device(s) on the vehicle 702 and/or the drive system(s) 714. Also, the communication connection(s) 710 can allow the vehicle 702 to communicate with other nearby computing device(s) (e.g., other nearby vehicles, traffic signals, etc.).

The communications connection(s) 710 can include physical and/or logical interfaces for connecting the computing device(s) 704 to another computing device or one or more external networks 716 (e.g., the Internet). For example, the communications connection(s) 710 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s). In at least some examples, the communication connection(s) 710 may comprise the one or more modems as described in detail above.

In at least one example, the vehicle 702 can include one or more drive system(s) 714. In some examples, the vehicle 702 can have a single drive system 714. In at least one example, if the vehicle 702 has multiple drive systems 714, individual drive systems 714 can be positioned on opposite ends of the vehicle 702 (e.g., the front and the rear, etc.). In at least one example, the drive system(s) 714 can include one or more sensor system(s) 706 to detect conditions of the drive system(s) 714 and/or the surroundings of the vehicle 702. By way of example and not limitation, the sensor system(s) 706 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders can be unique to the drive system(s) 714. In some cases, the sensor system(s) 706 on the drive system(s) 714 can overlap or supplement corresponding systems of the vehicle 702 (e.g., sensor system(s) 706).

The drive system(s) 714 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 714 can include a drive system controller which can receive and preprocess data from the sensor system(s) 706 and to control operation of the various vehicle systems. In some examples, the drive system controller can include one or more processor(s) and memory communicatively coupled with the one or more processor(s). The memory can store one or more modules to perform various functionalities of the drive system(s) 714. Furthermore, the drive system(s) 714 also include one or more communication connection(s) that enable communication by the respective drive system with one or more other local or remote computing device(s).

The computing device(s) 704 can be similar to the vehicle computing device described above with reference to FIG. 1. The computing device(s) 704 can include one or more processor(s) 718 and memory 720 communicatively coupled with the one or more processor(s) 718. In the illustrated example, the memory 720 of the computing device(s) 704 stores a localization component 722, a perception component 724, a prediction component 726, a planning component 728, and one or more system controller(s) 730. Though depicted as residing in the memory 720 for illustrative purposes, it is contemplated that the localization component 722, the perception component 724, the prediction component 726, the planning component 728, and the one or more system controller(s) 730 can additionally, or alternatively, be accessible to the computing device(s) 704 (e.g., stored in a different component of vehicle 702 and/or be accessible to the vehicle 702 (e.g., stored remotely).

In memory 720 of the computing device(s) 704, the localization component 722 can include functionality to receive data from the sensor system(s) 706 to determine a position of the vehicle 702. For example, the localization component 722 can include and/or request/receive a three-dimensional map of an environment and can continuously determine a location of the autonomous vehicle within the map. In some instances, the localization component 722 can use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, and the like to accurately determine a location of the autonomous vehicle. In some instances, the localization component 722 can provide data to various components of the vehicle 702 to determine an initial position of an autonomous vehicle for generating a trajectory, as discussed herein.

The perception component 724 can include functionality to perform object detection, segmentation, and/or classification. In some examples, the perception component 724 can provide processed sensor data that indicates a presence of an entity that is proximate to the vehicle 702 and/or a classification of the entity as an entity type (e.g., car, pedestrian, cyclist, building, tree, road surface, curb, sidewalk, unknown, etc.). In additional and/or alternative examples, the perception component 724 can provide processed sensor data that indicates one or more characteristics associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

The perception component 724 can include functionality to store perception data generated by the perception component 724. In some instances, the perception component 724 can determine a track corresponding to an object that has been classified as an object type. For purposes of illustration only, the perception component 724, using sensor system(s) 706 can capture one or more images of an environment. The sensor system(s) 706 can capture images of an environment that includes an object, such as a pedestrian. The pedestrian can be at a first position at a time T and at a second position at time T+t (e.g., movement during a span of time t after time T). In other words, the pedestrian can move during this time span from the first position to the second position. Such movement can, for example, be logged as stored perception data associated with the object.

The stored perception data can, in some examples, include fused perception data captured by the vehicle. Fused perception data can include a fusion or other combination of sensor data from sensor system(s) 706, such as image sensors, lidar sensors, radar sensors, time-of-flight sensors, sonar sensors, global positioning system sensors, internal sensors, and/or any combination of these. The stored perception data can additionally or alternatively include classification data including semantic classifications of objects (e.g., pedestrians, vehicles, buildings, road surfaces, etc.) represented in the sensor data. The stored perception data can additionally or alternatively include a track data (positions, orientations, sensor features, etc.) corresponding to motion of objects classified as dynamic objects through the environment. The track data can include multiple tracks of multiple different objects over time. This track data can be mined to identify images of certain types of objects (e.g., pedestrians, animals, etc.) at times when the object is stationary (e.g., standing still) or moving (e.g., walking, running, etc.). In this example, the computing device determines a track corresponding to a pedestrian.

The prediction component 726 can generate one or more probability maps representing prediction probabilities of possible locations of one or more objects in an environment. For example, the prediction component 726 can generate one or more probability maps for vehicles, pedestrians, animals, and the like within a threshold distance from the vehicle 702. In some instances, the prediction component 726 can measure a track of an object and generate a discretized prediction probability map, a heat map, a probability distribution, a discretized probability distribution, and/or a trajectory for the object based on observed and predicted behavior. In some instances, the one or more probability maps can represent an intent of the one or more objects in the environment.

The planning component 728 can determine a path for the vehicle 702 to follow to traverse through an environment. For example, the planning component 728 can determine various routes and paths and various levels of detail. In some instances, the planning component 728 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 728 can generate an instruction for guiding the autonomous vehicle along at least a portion of the route from the first location to the second location. In at least one example, the planning component 728 can determine how to guide the autonomous vehicle from a first waypoint in the sequence of waypoints to a second waypoint in the sequence of waypoints. In some examples, the instruction can be a path, or a portion of a path. In some examples, multiple paths can be substantially simultaneously generated (i.e., within technical tolerances) in accordance with a receding horizon technique. A single path of the multiple paths in a receding data horizon having the highest confidence level may be selected to operate the vehicle.

In other examples, the planning component 728 can alternatively, or additionally, use data from the perception component 724 to determine a path for the vehicle 702 to follow to traverse through an environment. For example, the planning component 728 can receive data from the perception component 724 regarding objects associated with an environment. Using this data, the planning component 728 can determine a route to travel from a first location (e.g., a current location) to a second location (e.g., a target location) to avoid objects in an environment. In at least some examples, such a planning component 728 may determine there is no such collision free path and, in turn, provide a path which brings vehicle 702 to a safe stop avoiding all collisions and/or otherwise mitigating damage.

In at least one example, the computing device(s) 704 can include one or more system controller(s) 730, which can be configured to control steering, propulsion, braking, safety, emitters, communication, and other systems of the vehicle 702. These system controller(s) 730 can communicate with and/or control corresponding systems of the drive system(s) 714 and/or other components of the vehicle 702, which may be configured to operate in accordance with a path provided from the planning component 728.

The vehicle 702 can connect to computing device(s) 732 via network(s) 716 and can include one or more processor(s) 734 and memory 736 communicatively coupled with the one or more processor(s) 734. In at least one instance, the one or more processor(s) 734 can be similar to the processor(s) 718 and the memory 736 can be similar to the memory 720. In the illustrated example, the memory 736 of the computing device(s) 732 stores a log data component 738, an objects component 740, an attributes component 742, a triggering component 744, a scenario component 746, and a simulation component 748. Though depicted as residing in the memory 736 for illustrative purposes, it is contemplated that the log data component 738, the objects component 740, the attributes component 742, the trigger component 744, the scenario component 746, and the simulation component 748 can additionally, or alternatively, be accessible to the computing device(s) 732 (e.g., stored in a different component of computing device(s) 732 and/or be accessible to the computing device(s) 732 (e.g., stored remotely).

In the memory 736 of the computing device(s) 732, the log data component 738 can determine log data to be used for generating a simulated scenario. As discussed above, a database can store one or more log data. In some instances, the computing device(s) 732 can act as the database to store the log data. In some instances, the computing device(s) 732 can connect to a different computing device to access the log data database. The log data component 738 can to scan log data stored in the database and identify log data that contains an event of interest. As discussed above, in some instances, the log data can include an event marker that indicates that an event of interest is associated with a particular log data. In some instances, a user can select a log data of a set of log data to be used to generate a simulated scenario.

Additionally, the objects component 740 can identify one or more objects associated with the log data. For example, the objects component 740 can determine objects such as vehicles, pedestrians, animals, cyclists, trees, etc. in the log data and represented as simulated objects. In some instances, the objects component 740 can determine objects that interact with the vehicle associated with the log data. For purposes of illustration only, the objects component 740 can determine that an object traversed along a trajectory that began 100 meters from the vehicle and continued to traverse the environment in a direction that is away from the vehicle. The objects component 740 can determine not to incorporate that object into the simulated scenario as it did not interact with the vehicle and would not provide valuable testing/validation data.

The attributes component 742 can determine attributes associated with an object. In some examples, the attributes component 742 may be similar or identical to attributes component 306 discussed below in reference to FIGS. 3A-3B. For example, an attribute can include an object extent (also referred to as an object size, which may represent a length, width, height, and/or volume), an object classification, an object pose, an object trajectory, an object waypoint, an object instantiation attribute, and/or an object termination attribute.

As discussed above, the object extent can indicate a size and/or volume of the object (e.g., a length of 0.5 meters). The object classification can indicate a classification and/or type of the object (e.g., a vehicle, a pedestrian, a bicyclist, etc.). The object pose can indicate an object's x-y-z coordinates (e.g., a position or position data) in the environment and/or can include a pitch, a roll, and/or a yaw associated with the object. The object trajectory can indicate a trajectory followed by the object. The object waypoint can indicate a position in the environment that indicates a route between two locations.

In some instances, the attributes component 742 can filter objects based on filters to remove or discard portions of the log data. In some instances, the attributes component 742 can use an extent-based filter such that objects that are associated with an extent that does not meet or exceed the extent-based filter are removed and/or discarded from the log data. In some instances, the attributes component 742 can filter objects that do not meet or exceed a confidence threshold. By way of example and without limitation, the log data can indicate that an object is associated with a classification attribute of a pedestrian and a confidence value of associated with the classification of 5%. The attributes component 742 can have a confidence value threshold of 75% and filter the object based on the confidence value not meeting or exceeding the confidence value threshold. Examples of filters that can be used to remove and/or discard portions of the log data can be found, for example, in U.S. patent application Ser. No. 16/392,094 titled "Scenario Editor and Simulator" and filed Apr. 23, 2019 (describing methods of filtering one or more objects represented in log data based on parameters/attributes associated with the one or more objects).

The object instantiation attribute can indicate how the vehicle detected the object. For example, the object can enter a detection range of the vehicle by: (1) the vehicle approaching the object, (2) the object approaching the vehicle, and/or (3) the object becoming visible (unoccluded) or an occlusion cessation of the object. The object termination attribute can indicate how the vehicle can no longer detect the object. For example, the object can be in a position outside of the detection range of the vehicle by: (1) the vehicle moving away from the object, (2) the object moving away from the vehicle, and/or (3) the object becoming occluded or an occlusion of the object.

The attributes component 742 can determine object attributes for none, some, or all of the objects to be included in the simulated scenario. The attributes component 742 can use the determined object attributes to identify the inconsistencies in the log data. As discussed above, the attributes component 742 can use algorithms and/or techniques based on thresholds, standard deviation calculations, and/or other algorithms such as Z-Score, Dbscan, and/or Isolation Forests.

Additionally, the attributes component 742 can be configured to determine estimated attribute values and replace inconsistent attribute values using algorithms and/or techniques such as mean algorithms, median algorithms, mode algorithms, and/or other smoothing algorithms such as Additive smoothing, Butterworth filters, Chebyshev filters, Exponential smoothing, Kalman filters, Kernel smoothers, Local regression, and/or moving averages, etc.

The trigger component 744 can determine a trigger region associated with a simulated object. In some examples, the trigger region can correspond to a region of the environment that, when a simulated object (such as a simulated autonomous vehicle) is located within a threshold distance of, the simulated object can be instantiated or removed (e.g., destroyed) from the scenario, as discussed herein. For example, the log data can indicate that the vehicle detected a pedestrian at a particular distance ahead of the vehicle as the vehicle traversed along a trajectory. The scenario generator can determine a trigger region based on the distance and instantiate the simulated pedestrian in the simulated environment when the simulated vehicle reaches the trigger region. In some instances, the scenario generator can determine a trigger region to increase a likelihood of interaction with an object. In some instances, the trigger region can cause an action of a simulated object (e.g., when activated, cause an object to perform a lane change action).

In some instances, the trigger component 744 can determine an instantiation trigger region associated with multiple objects. By way of example and without limitation, the trigger component 744 can determine an instantiation trigger region such that when a simulated vehicle crosses the instantiation trigger region, a simulated pedestrian object is instantiated on a sidewalk 75 meters in front of the simulated vehicle and a simulated oncoming vehicle object is instantiated in an opposing traffic 100 meters in front of the simulated vehicle.

In some instances, the trigger component 744 can determine multiple trigger regions associated with a single object. By way of example and without limitation, a first region can be an instantiation trigger region associated with instantiating a simulated object when activated by a simulated vehicle. Additionally, a second region can be an action trigger region associated with causing the simulated object to perform an action (e.g., cause a simulated pedestrian to begin to cross the street at a crosswalk).

In some instances, the trigger component 744 can determine a trigger event associated with the simulated vehicle and/or simulated objects that cause an instantiation, a destruction, and/or an action of another object. By way of example and without limitation, the trigger component 744 can determine a trigger event associated with the simulated vehicle based on the simulated vehicle enabling an indicator to initiate a lane change action. The simulation component 748, as discussed in further detail below, can determine that enabling the indicator triggers an event associated with a simulated object in a lane adjacent to the simulated vehicle to accelerate. By way of an additional example and without limitation, a trigger event can be associated with a simulated object that when the simulated object passes a crosswalk, a simulated pedestrian will begin crossing the crosswalk.

The scenario component 746 can use the log data identified by the log data component 738 to generate a simulated scenario. The simulated scenario includes a simulated environment (e.g., roadways, road markers, buildings, etc.) and simulated objects (e.g., other vehicles, pedestrians, cyclists, animals, etc.). In some instances, the scenario component 746 can use the perception data generated by the perception component 724 to apply simulated object models to the simulated objects. For example, the scenario component 746 can identify a simulated vehicle model and apply it to the simulated objects associated with vehicles. In some instances, the scenario component 746 can identify a simulated pedestrian model and apply it to the simulated objects associated with pedestrians. In some instances, the simulated object models can use controllers that allow the simulated objects to react to the simulated environment and other simulated objects (e.g., modeling physics-based behaviors and incorporating collision checking). For example, a simulated vehicle object can stop at a crosswalk if a simulated pedestrian crosses the crosswalk as to prevent the simulated vehicle from colliding with the simulated pedestrian.

In some instances, the scenario component 746 can identify a simulated pedestrian model and apply it to the simulated objects associated with pedestrians. In some instances, the simulated object models can use controllers that allow the simulated objects to react to the simulated environment and other simulated objects (e.g., modeling physics-based behaviors and incorporating collision checking). For example, a simulated vehicle object can stop at a crosswalk if a simulated pedestrian crosses the crosswalk as to prevent the simulated vehicle from colliding with the simulated pedestrian.

In some instances, the log data can indicate that a particular object has a characteristic and apply that characteristic to the simulated object. For purposes of illustration only, the log data can indicate that an object travels at approximately 10 mph below the speed limit and accelerates slowly. The scenario component 746 can determine that the object is a cautious vehicle and apply a cautious object model to the corresponding simulated object in the simulated environment. In some instances, the scenario component 746 can determine, based on behavior data in the log data, that an object as an aggressive object, a passive object, a neutral object, and/or other types of behaviors and apply behavior instructions associated with the behavior (e.g., a passive behavior, a cautious behavior, a neutral behavior, and/or an aggressive behavior) to the simulated object.

In some instances, the scenario component 746 can use filters to remove objects represented in the log data from a simulated scenario based on attributes associated with the objects. In some instances, the scenario component 746 can filter objects based on an object/classification type (car, pedestrian, motorcycle, bicyclist, etc.), an object size (e.g., length, width, height, and/or volume), a confidence level, track length, an amount of interaction between the object and a vehicle generating the log data, and/or a time period.

By way of example and without limitation, the log data can include objects of varying sizes such as mailboxes and buildings. The scenario component 746 can use a volume-based filter such that objects that are associated with a volume greater equal to or greater than a threshold volume of three cubic meters, such as buildings, are represented in the simulated scenario and objects that are associated with a volume less than three cubic meters are not represented in the simulated scenario, such as the mailboxes. In some instances, the scenario component 746 can use a track length filter where objects that have track lengths (e.g., data associated with a physical distance or a period of time) that do not meet or exceed a track length threshold are filtered from the simulated scenario. This can result in a simulated scenario that omits objects associated with poor detections during the time of data capture. In some instances, the scenario component 746 can use a motion-based filter such that objects associated with motion or a trajectory according to the log data are represented in the simulated scenario. In some instances, the filters can be applied in combination or mutually exclusively.

In some instances, the scenario component 746 can filter objects that do not meet or exceed a confidence threshold. By way of example and without limitation, the log data can indicate that an object is associated with a classification attribute of a pedestrian and a confidence value of associated with the classification of 5%. The scenario component 746 can have a confidence value threshold of 75% and filter the object based on the confidence value not meeting or exceeding the confidence value threshold. In some instances, a user can provide a user-generated filter that includes one or more attribute thresholds such that the scenario component 746 can filter objects that do not meet or exceed the one or more attribute thresholds indicated by the user-generated filter.

The simulation component 748 can execute the simulated scenario as a set of simulation instructions and generate simulation data. In some instances, the simulation component 748 can execute multiple simulated scenarios simultaneously and/or in parallel. This can allow a user to edit a simulated scenario and execute permutations of the simulated scenario with variations between each simulated scenario.

Additionally, the simulation component 748 can determine an outcome for the simulated scenario. For example, the simulation component 748 can execute the scenario for use in a simulation for testing and validation. The simulation component 748 generate the simulation data indicating how the autonomous controller performed (e.g., responded) and can compare the simulation data to a predetermined outcome and/or determine if any predetermined rules/assertions were broken/triggered.

In some instances, the predetermined rules/assertions can be based on the simulated scenario (e.g., traffic rules regarding crosswalks can be enabled based on a crosswalk scenario or traffic rules regarding crossing a lane marker can be disabled for a stalled vehicle scenario). In some instances, the simulation component 748 can enable and disable rules/assertions dynamically as the simulation progresses. For example, as a simulated object approaches a school zone, rules/assertions related to school zones can be enabled and disabled as the simulated object departs from the school zone. In some instances, the rules/assertions can include comfort metrics that relate to, for example, how quickly an object can accelerate given the simulated scenario.

Based at least in part on determining that the autonomous controller performed consistent with the predetermined outcome (that is, the autonomous controller did everything it was supposed to do) and/or determining that a rule was not broken or an assertion was not triggered, the simulation component 748 can determine that the autonomous controller succeeded. Based at least in part on determining that the autonomous controller performance was inconsistent with the predetermined outcome (that is, the autonomous controller did something that it wasn't supposed to do) and/or determining that a rule was broken or than an assertion was triggered, the simulation component 748 can determine that the autonomous controller failed. Accordingly, based at least in part on executing the simulated scenario, simulation data can indicate how the autonomous controller responds to each simulated scenario, as described above and determine a successful outcome or an unsuccessful outcome based at least in part on the simulation data.

The processor(s) 718 of the computing device(s) 704 and the processor(s) 734 of the computing device(s) 732 can be any suitable processor capable of executing instructions to process data and perform operations as described herein. By way of example and not limitation, the processor(s) 718 and 734 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 720 computing device(s) 704 and the memory 736 of the computing device(s) 732 are examples of non-transitory computer-readable media. The memory 720 and 736 can store an operating system and one or more software applications, instructions, programs, and/or data to implement the methods described herein and the functions attributed to the various systems. In various implementations, the memory 720 and 736 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, in some instances, the components in the memory 720 and 736 can be implemented as a neural network.

Figure 8:
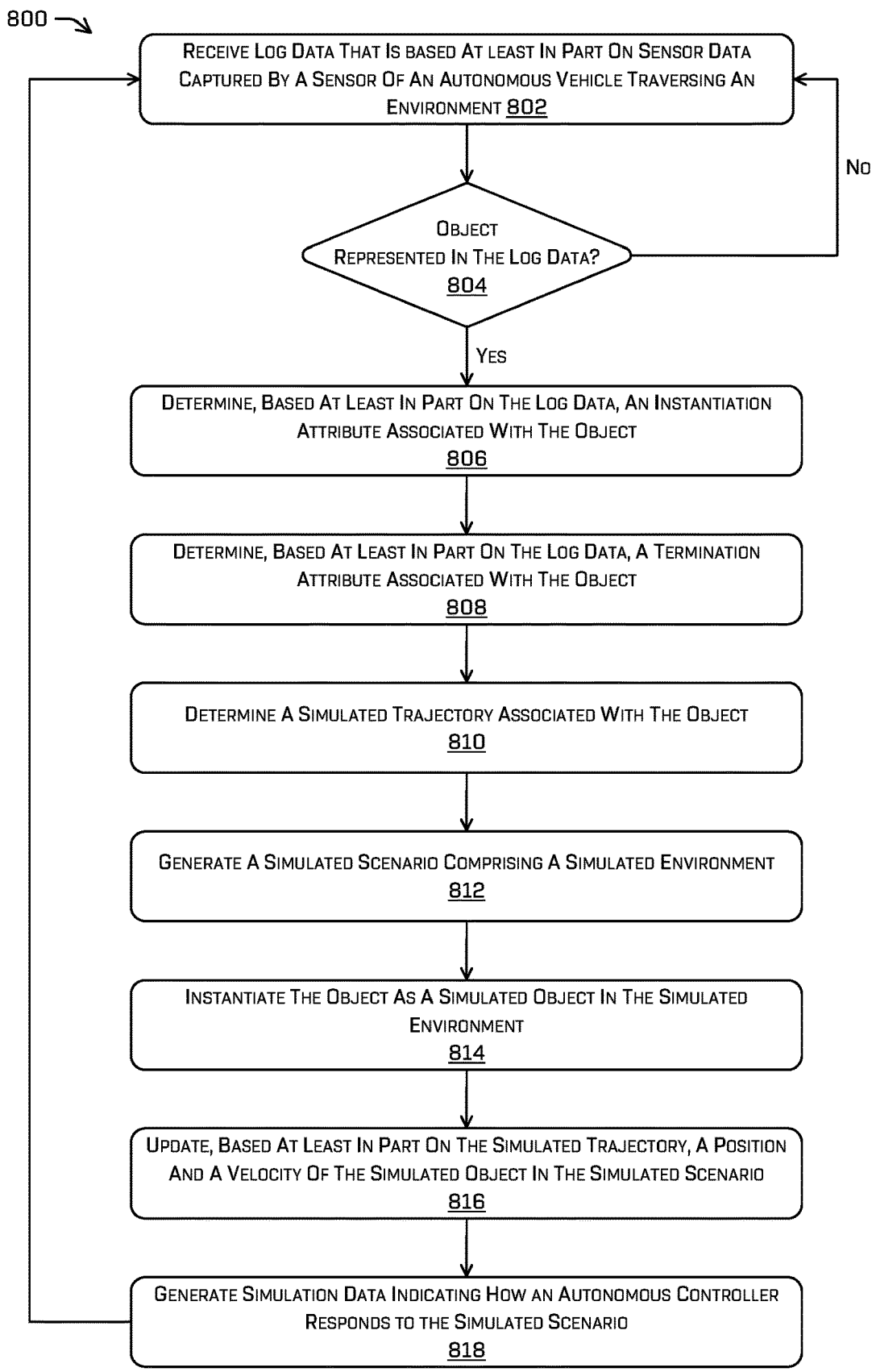
FIG. 8 depicts an example process for generating simulation data based on log data captured by a vehicle traversing an environment.

FIG. 8 depicts an example process 800 for executing the simulation instructions and generating simulation data. In some instances, some or all of example process 800 can be performed by one or more components in FIG. 7, as described herein. The example process 800 is described with reference to the vehicle 702 and the computing device(s) 732 in FIG. 7. Additionally, some portions of example process 800 can be omitted, replaced, and/or reordered while still providing the functionality of determining whether a computing device should remain in a standby state.

At operation 802, the log data component 738 can receive the log data of an autonomous vehicle traversing an environment. In some instances, the log data component 738 can identify log data within a database that stores a plurality of log data.

At operation 804, the example process 800 continues by determining if an object is represented in the log data. In some instances, the object can be the vehicle 702 that generated the log data. In some instances, the object can be an object in the environment that is distinct from the vehicle 702. In at least some examples, log data may include, for example, track data, object detections, and the like such that determination may be performed on the log data directly.

At operation 806, the attributes component 742 can determine, based at least in part on the log data, an instantiation attribute associated with the object. For example, the instantiation attribute can indicate that, in the log data, the vehicle approached the object, the object approached the vehicle, and/or the object became visible to be detected by a sensor and/or a perception system of the vehicle. In some instances, the trigger region can be associated with the instantiation attribute. The trigger component 744 can determine a location of an instantiation trigger region (e.g., based on a perception range associated with the vehicle and/or based on when an object was detected in an environment in log data) and when a simulated vehicle activates the instantiation trigger region in a simulated environment (e.g., by traversing over the instantiation trigger region), a simulated object can be instantiated in the simulated environment (e.g., based on the perception range associated with the vehicle and/or a location of the simulated vehicle in the simulated environment).

At operation 808, the attributes component 742 can determine, based at least in part on the log data, a termination attribute associated with the object. For example, the termination attribute can indicate that, in the log data, the vehicle traversed away from the object, that the object traversed away from the vehicle, and/or that the object became occluded and could not be detected by a sensor and/or a perception system of the vehicle. In some instances, the trigger component 744 can determine a location of a destruction trigger region (e.g., based on the perception range associated with the vehicle). When a simulated vehicle activates the destruction trigger region in a simulated environment (e.g., by traversing over the destruction trigger region), the simulated object can be destroyed/despawned (e.g., based on the perception range associated with the vehicle and/or a location of the simulated vehicle in the simulated environment).

At operation 810, the attributes component 742 can determine a simulated trajectory associated with the object. The simulated trajectory can be based on the trajectory attribute of the object that indicates the trajectory represented in the log file. As discussed above, the attributes component 742 can determine waypoint(s) and/or paths associated with the simulated object to determine the simulated trajectory associated with the object. By way of example and without limitation, such waypoints or paths can be based at least in part on the log data representing the object corresponding to the simulated object. In some examples, waypoints can be determined based on a curvature of a path segment or can be added manually in a user interface. Such waypoints or paths can be associated with various costs or weights that influence a behavior (e.g., trajectory) of the simulated object in the simulated environment.

At operation 812, the scenario component 746 can generate the simulation instructions that, when executed by a simulator, can generate simulation data that represents a response of a vehicle controller operating in the simulated environment. The simulation instructions can describe, for example, a placement of objects in a simulated environment, a trajectory for one or more objects, and trigger regions associated with an instantiation of objects, etc.

At operation 814, the simulation component 748 can execute the simulation instructions and instantiate the object as a simulated object in the simulated environment. In some instances, the simulation component 748 can instantiate the simulated object based on a trigger region associated with the simulated object.

At operation 816, the simulation component 748 can update a position and velocity of the simulated object. As discussed above, the simulated object can update the position and velocity of the simulated object based on attributes determined by the attributes component 742. In some instances, a position and/or velocity of a simulated object can be updated based on a control of the simulated object using an object controller. The object controller can determine an object state and adjust a control of the object to update the simulated object's position and/or velocity.

At operation 818, the simulation component 748 can generate simulation data that can indicate how an autonomous controller responds to the simulated scenario. In some instances, the simulation component 748 can determine an outcome for the based on the simulation data. For example, the simulation component 748 can execute the scenario for use in a testing and validation of the autonomous controller. The simulation component 748 can generate the simulation data indicating how the autonomous controller performed (e.g., responded) and can compare the simulation data to a predetermined outcome and/or determine if any predetermined rules/assertions were broken/triggered.

In some instances, the predetermined rules/assertions can be based on the simulated scenario (e.g., traffic rules regarding crosswalks can be enabled based on a crosswalk scenario or traffic rules regarding crossing a lane marker can be disabled for a stalled vehicle scenario). In some instances, the simulation component 748 can enable and disable rules/assertions dynamically as the simulation progresses. For example, as a simulated object approaches a school zone, rules/assertions related to school zones can be enabled and disabled as the simulated object departs from the school zone. In some instances, the rules/assertions can include comfort metrics that relate to, for example, how quickly an object can accelerate given the simulated scenario.

Based at least in part on determining that the autonomous controller performed consistent with the predetermined outcome (that is, the autonomous controller did everything it was supposed to do) and/or determining that a rule was not broken or an assertion was not triggered, the simulation component 748 can determine that the autonomous controller succeeded. Based at least in part on determining that the autonomous controller performance was inconsistent with the predetermined outcome (that is, the autonomous controller did something that it wasn't supposed to do) and/or determining that a rule was broken or than an assertion was triggered, the simulation component 748 can determine that the autonomous controller failed. Accordingly, based at least in part on executing the simulated scenario, simulation data can indicate how the autonomous controller responds to each simulated scenario, as described above and determine a successful outcome or an unsuccessful outcome based at least in part on the simulation data.

Accordingly, the techniques discussed herein including determining improved attribute data for objects detected in an environment, as well as providing a robust implementation of a scenario editor and simulator to allow for robust simulation of autonomous vehicles based on improved synthetic data, increasing the safety of the vehicles.

Example Clauses

A: A system comprising: one or more processors; and one or more computer-readable media storing computer-executable instructions that, when executed, cause the one or more processors to perform operations comprising: receiving log data based at least in part on sensor data captured by a sensor of an autonomous vehicle traversing an environment; determining first object attribute data for an object represented in the log data, the first object attribute data associated with a first time; determining a first confidence value associated with the first object attribute data; determining a first distance between a first location associated with the object and a second location associated with the sensor at the first time; determining second object attribute data for the object represented in the log data, the second object attribute data associated with a second time; determining a second confidence value associated with the second object attribute data; determining a second distance between a third location associated with the object and a fourth location associated with the sensor at the second time; determining, based at least in part on the first confidence value and the first distance, a first weight associated with the first object attribute data; determining, based at least in part on the second confidence value and the second distance, a second weight associated with the second object attribute data; determining, based at least in part on the first object attribute data, the first weight, the second object attribute data, and the second weight, an updated object attribute data for the object; generating a simulated scenario comprising a simulated environment; instantiating, based at least in part on the updated object attribute data, the object as a simulated object in the simulated environment; and generating simulation data comprising data generated by an autonomous controller in response to the simulated scenario.

B. The system of paragraph A, wherein the first object attribute data is first classification data, wherein the second object attribute data is second classification data that is different than the first classification data, the operations further comprising: comparing the first weight and the second weight; and determining, based at least in part on the first weight being greater than the second weight, the first object attribute data as the updated object attribute data.

C. The system of any one of paragraphs A or B, wherein the first object attribute data is a first numerical value, the second object attribute data is second numerical value that is different than the first numerical value, and wherein determining the updated object attribute data for the object comprises determining a third numerical value based at least in part on the first numerical value, the first weight, the second numerical value, and the second weight.

D. The system of any one of paragraphs A-C, wherein the first object attribute data is associated with a changeable attribute type, and wherein instantiating the simulated object in the simulated environment comprises: determining a first simulation time in the simulated scenario at which the simulated object is instantiated; determining, based on the log data, a first observation time associated with the first simulation time in the simulated scenario; determining a previous object attribute data for the object represented in the log data, wherein the previous object attribute data is associated with a second observation time before the first observation time; determining a first distance associated with the previous object attribute data; determining a subsequent object attribute data for the object represented in the log data, wherein the subsequent object attribute data is associated with a third observation time after the first observation time; and determining a second distance associated with the subsequent object attribute data, wherein the updated object attribute data for the object is determined based at least in part on the previous object attribute data for the object, the first distance, the subsequent object attribute data for the object, and the second distance.

E. The system of any one of paragraphs A-D, wherein the first object attribute data is associated with an attribute type indicating at least one of: a size of the object, a classification type of the object, a pose of the object, a trajectory of the object, a velocity of the object, a state of the object, or a position of the object.

F. A method comprising: receiving data that is based at least in part on sensor data captured by a sensor in an environment; determining object attribute data for an object represented in the data; determining a confidence value associated with the object attribute data; determining a distance between a first location associated with the object and a second location associated with the sensor; determining, based at least in part on the confidence value and the distance, a weight associated with the object attribute data; determining, based at least in part on the object attribute data and the weight, an updated object attribute data for the object; associating the updated object attribute data with the object; and executing a simulation based at least in part on the updated object attribute data.

G. The method of paragraph F, wherein the weight is a first weight, the method further comprising: determining second object attribute data for the object represented in the data, wherein the object attribute data is associated with a first time and the second object attribute data is associated with a second time; determining a second confidence value associated with the second object attribute data; and determining a second distance between a third location associated with the object and a fourth location associated with the sensor at the second time; and determining, based at least in part on the second confidence value and the second distance, a second weight associated with the second object attribute data, wherein the updated object attribute data for the object is determined based at least in part on the object attribute data, the weight, the second object attribute data, and the second weight.

H. The method of paragraph G, wherein the object attribute data is first classification data, wherein the second object attribute data is second classification data that is different than the first classification data, the method further comprising: comparing the first weight and the second weight; and determining, based at least in part on the first weight being greater than the second weight, the object attribute data as the updated object attribute data.

I. The method of paragraph G, wherein the object attribute data is a first numerical value, the second object attribute data is second numerical value that is different than the first numerical value, and wherein determining the updated object attribute data for the object comprises determining a third numerical value based at least in part on the first numerical value, the weight, the second numerical value, and the second weight.

J. The method of any one of paragraphs F-I, wherein the object attribute data is associated with an attribute type indicating at least one of: a size of the object, a classification type of the object, a pose of the object, a trajectory of the object, a velocity of the object, a state of the object, or a position of the object.

K. The method of any one of paragraphs F-J, further comprising: generating a simulated environment; instantiating a simulated autonomous vehicle in the simulated environment; and instantiating, based at least in part on the updated object attribute data, the object as a simulated object in the simulated environment.

L. The method of paragraph K, further comprising: determining, based at least in part on the data, a trigger region in the simulated environment associated with the object, wherein instantiating the object as the simulated object is based at least in part on the trigger region and a position of the simulated autonomous vehicle within the simulated environment.

M. The method of paragraph K, wherein the object attribute data is associated with a changeable attribute type, and wherein instantiating the simulated object in the simulated environment comprises: determining a first simulation time in the simulated environment at which the simulated object is instantiated; determining, based on the data, a first observation time associated with the first simulation time in the simulated environment; determining a previous object attribute data for the object represented in the data, wherein the previous object attribute data is associated with a second observation time before the first observation time; determining a first distance associated with the previous object attribute data; determining a subsequent object attribute data for the object represented in the data, wherein the subsequent object attribute data is associated with a third observation time after the first observation time; and determining a second distance associated with the subsequent object attribute data, wherein the updated object attribute data for the object is determined based at least in part on the previous object attribute data for the object, the first distance, the subsequent object attribute data for the object, and the second distance.

N. One or more non-transitory computer-readable media storing instructions executable by one or more processors, wherein the instructions, when executed, cause the one or more processors to perform operations comprising: receiving data that is based at least in part on sensor data captured by a sensor in an environment; determining object attribute data for an object represented in the data; determining a distance between a first location associated with the object and a second location associated with the sensor; determining, based at least in part on the distance, a weight associated with the object attribute data; determining, based at least in part on the object attribute data and the weight, an updated object attribute data for the object; associating the updated object attribute data with the object; and executing a simulation based at least in part on the updated object attribute data.

O. The one or more non-transitory computer-readable media of paragraph N, the operations further comprising: determining a confidence value associated with the object attribute data, wherein the weight associated with the object attribute data is determined based at least in part on the distance and the confidence value.

P. The one or more non-transitory computer-readable media of any one of paragraphs N or O, determining second object attribute data for the object represented in the data, wherein the object attribute data is associated with a first time and the second object attribute data is associated with a second time; determining a second distance between a third location associated with the object and a fourth location associated with the sensor at the second time; and determining, based at least in part on the second distance, a second weight associated with the second object attribute data, wherein the updated object attribute data for the object is determined based at least in part on the object attribute data, the weight, the second object attribute data, and the second weight.

Q. The one or more non-transitory computer-readable media of paragraph P, wherein the object attribute data is first classification data, wherein the second object attribute data is second classification data that is different than the first classification data, the operations further comprising: comparing the weight and the second weight; and determining, based at least in part on the weight being greater than the second weight, the object attribute data as the updated object attribute data.

R. The one or more non-transitory computer-readable media of paragraph P, wherein the object attribute data is a first numerical value, the second object attribute data is second numerical value that is different than the first numerical value, and wherein determining the updated object attribute data for the object comprises determining a third numerical value based at least in part on the first numerical value, the weight, the second numerical value, and the second weight.

S. The one or more non-transitory computer-readable media of any one of paragraphs N-R, the operations further comprising: generating a simulated environment; instantiating a simulated autonomous vehicle in the simulated environment; and instantiating, based at least in part on the updated object attribute data, the object as a simulated object in the simulated environment.

T. The one or more non-transitory computer-readable media of paragraph S, wherein the object attribute data is associated with a changeable attribute type, and wherein instantiating the simulated object in the simulated environment comprises: determining a first simulation time in the simulated environment at which the simulated object is instantiated; determining, based on the data, a first observation time associated with the first simulation time in the simulated environment; determining a previous object attribute data for the object represented in the data, wherein the previous object attribute data is associated with a second observation time before the first observation time; determining a first distance associated with the previous object attribute data; determining a subsequent object attribute data for the object represented in the data, wherein the subsequent object attribute data is associated with a third observation time after the first observation time; and determining a second distance associated with the subsequent object attribute data, wherein the updated object attribute data for the object is determined based at least in part on the previous object attribute data for the object, the first distance, the subsequent object attribute data for the object, and the second distance.

While the example clauses described above are described with respect to one particular implementation, it should be understood that, in the context of this document, the content of the example clauses can also be implemented via a method, device, system, computer-readable medium, and/or another implementation. Additionally, any of examples A-T may be implemented alone or in combination with any other one or more of the examples A-T.

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system comprising:
one or more processors; and
one or more non-transitory computer-readable media storing computer-executable instructions that, when executed, cause the one or more processors to perform operations comprising:
receiving log data based at least in part on sensor data captured by a sensor of an autonomous vehicle traversing an environment, the log data including:
a first attribute value for an object represented in the log data, the first attribute value associated with a first time;
a first confidence value associated with the first attribute value;
a second attribute value for the object represented in the log data, the second attribute value associated with a second time different from the first time; and
a second confidence value associated with the second attribute value;
determining a first distance between a first location associated with the object and a second location associated with the sensor at the first time;
determining a second distance between a third location associated with the object and a fourth location associated with the sensor at the second time;
determining, based at least in part on the first confidence value and the first distance, a first weight associated with the first attribute value;
determining, based at least in part on the second confidence value and the second distance, a second weight associated with the second attribute value;
determining, based at least in part on the first attribute value, the first weight, the second attribute value, and the second weight, a simulated object attribute for a simulated object;
generating a simulated scenario comprising a simulated environment;
instantiating, based at least in part on the simulated object attribute, the simulated object in the simulated environment; and
generating simulation data comprising data generated by an autonomous controller in response to the simulated scenario.

2. The system of claim 1, wherein the first attribute value is a first object classification, wherein the second object attribute value is a second object classification that is different than the first object classification, the operations further comprising:
comparing the first weight and the second weight; and
determining, based at least in part on the first weight being greater than the second weight, the first object classification as the simulated object attribute.

3. The system of claim 1, wherein the first attribute value is a first numerical value, the second attribute value is second numerical value that is different than the first numerical value, and
wherein determining the simulated object attribute for the simulated object comprises determining a third numerical value based at least in part on the first numerical value, the first weight, the second numerical value, and the second weight.

4. The system of claim 1, wherein the first attribute value is associated with a changeable attribute type, and wherein instantiating the simulated object in the simulated environment comprises:
determining a first simulation time in the simulated scenario at which the simulated object is instantiated;
determining, based on the log data, a first observation time associated with the first simulation time in the simulated scenario;
determining a previous attribute value for the object represented in the log data, wherein the previous attribute value is associated with a second observation time before the first observation time;
determining a third distance associated with the previous attribute value;
determining a subsequent attribute value for the object represented in the log data, wherein the subsequent attribute value is associated with a third observation time after the first observation time; and determining a fourth distance associated with the subsequent attribute value, wherein the simulated object attribute for the simulated object is determined based at least in part on the previous attribute value for the object, the third distance, the subsequent attribute value for the object, and the fourth distance.

5. The system of claim 1, wherein the first attribute value is associated with an attribute type indicating at least one of:
a size of the object,
a classification type of the object,
a pose of the object,
a trajectory of the object,
a velocity of the object,
a state of the object, or
a position of the object.

6. A method comprising:
receiving log data that is based at least in part on sensor data captured by a sensor in an environment, the log data including:
a first attribute value for an attribute of an object represented in the log data at a first time; and
a first confidence value associated with the first attribute value;
determining a first distance between a first location associated with the object represented in the log data and a second location associated with the sensor at the first time;
determining a simulated object attribute for a simulated object, based at least in part on the first attribute value, data and the first confidence value, and the first distance; and
executing a simulation based at least in part on the log data, wherein executing the simulation includes controlling the simulated object based at least in part on the simulated object attribute.

7. The method of claim 6, wherein the log data further includes:
a second attribute value for the object represented in the log data, wherein the second attribute value is associated with a second time different from the first time; and
a second confidence value associated with the second attribute value;
wherein the method further comprises determining a second distance between a third location associated with the object and a fourth location associated with the sensor at the second time; and
wherein determining the simulated object attribute for the simulated object is further based at least in part on the second attribute value, the second confidence value, and the second distance.

8. The method of claim 7, wherein the first attribute value is a first object classification, wherein the second attribute value is second object classification that is different than the first object classification, the method further comprising:
determining a first weight based at least in part on the first confidence value and the first distance;
determining a second weight based at least in part on the second confidence value and the second distance;
comparing the first weight and the second weight; and
determining, based at least in part on the first weight being greater than the second weight, the first object classification as the simulated object attribute.

9. The method of claim 7, wherein the first attribute value is a first numerical value, the second attribute value is second numerical value that is different than the first numerical value, and wherein determining the simulated object attribute for the simulated object comprises:
determining a first weight based at least in part on the first confidence value and the first distance;
determining a second weight based at least in part on the second confidence value and the second distance; and
determining a third numerical value based at least in part on the first numerical value, the first weight, the second numerical value, and the second weight.

10. The method of claim 6, wherein the first attribute value is associated with an attribute type indicating at least one of:
a size of the object,
a classification type of the object,
a pose of the object,
a trajectory of the object,
a velocity of the object,
a state of the object, or
a position of the object.

11. The method of claim 6, wherein executing the simulation comprises:
generating a simulated environment;
instantiating a simulated autonomous vehicle in the simulated environment; and
instantiating, based at least in part on the simulated object attribute, the simulated object in the simulated environment.

12. The method of claim 11, further comprising:
determining, based at least in part on the log data, a trigger region in the simulated environment associated with the simulated object,
wherein instantiating the simulated object is based at least in part on the trigger region and a position of the simulated autonomous vehicle within the simulated environment.

13. The method of claim 11, wherein the first attribute value is associated with a changeable attribute type, and wherein instantiating the simulated object in the simulated environment comprises:
determining a first simulation time in the simulated environment at which the simulated object is instantiated;
determining, based on the log data, a first observation time associated with the first simulation time in the simulated environment;
determining a previous attribute value for the object represented in the log data, wherein the previous attribute value is associated with a second observation time before the first observation time;
determining a second distance associated with the previous attribute value;
determining a subsequent attribute value for the object represented in the log data, wherein the subsequent attribute value is associated with a third observation time after the first observation time; and
determining a third distance associated with the subsequent attribute value,
wherein the simulated object attribute for the simulated object is determined based at least in part on the previous attribute value, the second distance, the subsequent attribute value, and the third distance.

14. One or more non-transitory computer-readable media storing instructions executable by one or more processors, wherein the instructions, when executed, cause the one or more processors to perform operations comprising:
receiving log data that is based at least in part on sensor data captured by a sensor in an environment, the log data including:

a first attribute value for an attribute of an object represented in the log data at a first time; and a first confidence value associated with the first attribute value;

determining a first distance between a first location associated with the object represented in the log data and a second location associated with the sensor at the first time;

determining a simulated object attribute for a simulated object, based at least in part on the first attribute value, the first confidence value, and the first distance; and executing a simulation based at least in part on the log data, wherein executing the simulation includes controlling the simulated object based at least in part on the simulated object attribute.

15. The one or more non-transitory computer-readable media of claim 14, the operations further comprising:

determining a weight value associated with the first attribute value, wherein the weight value associated with the first attribute value is determined based at least in part on the first distance and the first confidence value.

16. The one or more non-transitory computer-readable media of claim 14, wherein the log data further includes:

a second attribute value for the object represented in the log data, wherein the second attribute value is associated with a second time different from the first time; and a second confidence value associated with the second attribute value wherein the operations further comprise determining a second distance between a third location associated with the object and a fourth location associated with the sensor at the second time; and wherein determining the simulated object attribute for the simulated object is further based at least in part on the second attribute value, the second confidence value, and the second distance.

17. The one or more non-transitory computer-readable media of claim 16, wherein the first attribute value is a first object classification, wherein the second attribute value is second object classification that is different than the first object classification, the operations further comprising:

determining a first weight based at least in part on the first confidence value and the first distance;

determining a second weight based at least in part on the second confidence value and the second distance;

comparing the first weight and the second weight; and determining, based at least in part on the first weight being greater than the second weight, the first object classification as the simulated object attribute.

18. The one or more non-transitory computer-readable media of claim 16, wherein the first attribute value is a first numerical value, the second attribute value is second numerical value that is different than the first numerical value, and wherein determining the simulated object attribute for the simulated object comprises:

determining a first weight based at least in part on the first confidence value and the first distance;

determining a second weight based at least in part on the second confidence value and the second distance; and determining a third numerical value based at least in part on the first numerical value, the first weight, the second numerical value, and the second weight.

19. The one or more non-transitory computer-readable media of claim 14, wherein executing the simulation comprises:

generating a simulated environment;

instantiating a simulated autonomous vehicle in the simulated environment; and instantiating, based at least in part on the simulated object attribute, the simulated object in the simulated environment.

20. The one or more non-transitory computer-readable media of claim 19, wherein the first attribute value is associated with a changeable attribute type, and wherein instantiating the simulated object in the simulated environment comprises:

determining a first simulation time in the simulated environment at which the simulated object is instantiated;

determining, based on the log data, a first observation time associated with the first simulation time in the simulated environment;

determining a previous attribute value for the object represented in the log data, wherein the previous attribute value is associated with a second observation time before the first observation time;

determining a second distance associated with the previous attribute value;

determining a subsequent attribute value for the object represented in the log data, wherein the subsequent attribute value is associated with a third observation time after the first observation time; and determining a third distance associated with the subsequent attribute value, wherein the simulated object attribute for the simulated object is determined based at least in part on the previous attribute value, the second distance, the subsequent attribute value, and the third distance.

* * * * *

UNITED STATES PATENT AND TRADEMARK OFFICE
CERTIFICATE OF CORRECTION

| | |
|---|---|
| PATENT NO. | : 11,526,721 B1 |
| APPLICATION NO. | : 16/798073 |
| DATED | : December 13, 2022 |
| INVENTOR(S) | : O'Malley |

It is certified that error appears in the above-identified patent and that said Letters Patent is hereby corrected as shown below:

In the Claims

Column 50, Lines 32-33, Claim 2 change "the second object attribute value" to -- the second attribute value --.

Column 51, Line 31, Claim 6 change "data and the first confidence value" to -- the first confidence value --.

Signed and Sealed this
Thirty-first Day of January, 2023

Katherine Kelly Vidal
*Director of the United States Patent and Trademark Office*